United States Patent [19]
Gallagher et al.

[11] Patent Number: 5,552,608
[45] Date of Patent: Sep. 3, 1996

[54] CLOSED CYCLE GAS CRYOGENICALLY COOLED RADIATION DETECTOR

[75] Inventors: Brian W. Gallagher, Highland Lakes; Costas Blionas, Hackensack, both of N.J.; Joseph A. Nicolosi, Bardonia, N.Y.; Richard Barbara, Oakland, N.J.

[73] Assignee: Philips Electronics North America Corporation, New York, N.Y.

[21] Appl. No.: 494,501

[22] Filed: Jun. 26, 1995

[51] Int. Cl.$^6$ ..................................................... G01T 1/00
[52] U.S. Cl. ..................... 250/370.15; 250/352; 250/347
[58] Field of Search ............................ 250/370.15, 352, 250/310, 397; 62/51.1, 51.2, 50.7

[56] References Cited

U.S. PATENT DOCUMENTS

| | | | |
|---|---|---|---|
| 3,786,269 | 1/1974 | Cooper | 250/334 |
| 3,851,173 | 11/1974 | Taylor et al. | 250/332 |
| 3,864,570 | 2/1975 | Zingaro | 250/272 |
| 4,206,354 | 6/1980 | Small, Jr. | 250/349 |
| 4,464,035 | 8/1984 | Taniguchi et al. | 354/324 |
| 4,474,036 | 10/1984 | Ball et al. | 62/514 R |
| 4,886,240 | 12/1989 | Rich | 250/352 |
| 4,910,399 | 3/1990 | Taira et al. | 250/310 |
| 4,931,650 | 6/1990 | Lowe et al. | 250/397 |
| 5,075,555 | 12/1991 | Woldseth et al. | 250/370.15 |
| 5,177,364 | 1/1993 | Gowlett et al. | 250/352 |
| 5,225,677 | 7/1993 | Yeh et al. | 250/336.1 |
| 5,235,817 | 8/1993 | Gallagher et al. | 62/51.1 |
| 5,268,578 | 12/1993 | Yeh | 250/370.01 |
| 5,274,237 | 12/1993 | Gallagher et al. | 250/370.15 |
| 5,313,801 | 5/1994 | Bonney | 62/51.2 |
| 5,337,572 | 8/1994 | Longsworth | 62/51.2 |

FOREIGN PATENT DOCUMENTS

| | | |
|---|---|---|
| 0006297 | 1/1980 | European Pat. Off. . |
| 921273 | 3/1963 | United Kingdom . |
| 1192897 | 5/1970 | United Kingdom . |
| 2179785 | 3/1987 | United Kingdom . |
| 2192091 | 12/1987 | United Kingdom . |

OTHER PUBLICATIONS

Material Safety Data Sheet, Nov. 1988, L-4888-B no page number.
*The Book of the CCIR Radiopaging Code No. 1*, POCSAG, pp. 2, 4, 8–12 and 38–40 no dated.

Primary Examiner—Davis L. Willis
Assistant Examiner—Kiet T. Nguyen
Attorney, Agent, or Firm—Anne E. Barschall

[57] ABSTRACT

A radiation detector having an evacuated envelope, a radiation detector on a cold finger support in the evacuated space, a closed cycle gas cooling system to cool the cold finger to provide cryogenic operation of the radiation detector, and a getter in the evacuated space to maintain an evacuated condition. The evacuated envelope includes a radiation window. The radiation detector is preferably an X-ray detector employed in an energy dispersive spectrometry system. The evacuated space is preferably held at a pressure of less than about 1 mTorr to achieve molecular flow of remaining gas molecules, minimizing parasitic heat input. The closed cycle gas cooling system employs compressed refrigerant, which is precooled in a counterflow heat exchanger and allowed to expand in proximity to the cold finger, thus absorbing heat and maintaining cryogenic temperatures. A getter material, preferably activated carbon, is provided to absorb gasses and maintain the low pressure during operation. A vibration effect attenuation system is provided to reduce effect of cooler induced reduction in detector resolution.

61 Claims, 9 Drawing Sheets

CLOSED CYCLE GAS CRYOGENICALLY COOLED RADIATION DETECTOR

FIELD OF THE INVENTION

The present invention relates to the field of cryogenic radiation detectors, and more particularly to mechanically cooled cryogenic radiation detectors operating under vacuum conditions.

BACKGROUND OF THE INVENTION

Radiation detectors, which may be X-ray detectors, infrared radiation detectors or other types, commonly have an evacuated envelope with a vacuum space, at least one radiation detector element being mounted in the vacuum space. These devices include scanning electron microscopes (SEM), X-ray spectrometers, infrared spectrometers, and other known devices. For optimal operation, with low electronic noise and high sensitivity, these detectors are operated cryogenically. Therefore, the detector is provided with a cooling device. In order to reduce parasitic heat input to the system, the detector and cooling system are generally insulated from the environment in a Dewar, having a vacuum space within a sealed envelope or chamber. A cooling element is provided in the chamber and serves to cool the detector element during operation of the detector. The vacuum minimized heat conduction through a gas-filled space, and the surfaces are formed with low heat radiation emissivity construction. In general, the detector may be allowed to return to ambient temperature when not in operation.

A member, in thermal communication with the cooling device, protrudes into the chamber and supports the detector. As is known, the member is actively cooled by the Joule-Thomson effect (gas expansion), liquid nitrogen (or other gas), Stirling cycle cooling, Peltier junctions, or by other known means. The cooled protruding member is often termed "the cold finger" of the detector. The cold finger is also thermally coupled to a detector to be cooled, and generally acts as a mechanical support as well.

In order to achieve the desired cryogenic temperatures, around 87K at the junction of the detector holder and cold finger for lithium drifted silicon X-ray detectors, and low vibration, the Dewar is typically filled with liquid nitrogen, which exists at 77K in the liquid state at standard pressure, which is allowed to vaporize, providing cooling of the cold finger in the cold-finger assembly. The radiation detector is thermally conductively attached to an end of the cold finger opposite the cryogenically cooled end. The finger is thus insulated from ambient atmosphere and contained within a housing. The vaporization of liquid nitrogen in a Dewar to achieve cryogenic temperatures is an inherently low vibration-producing action, and therefore liquid nitrogen is typically employed to cool vibration sensitive instruments. Liquid nitrogen is expensive, requires frequent refilling of an internal supply in the detector, and is often delivered in bulk from off-site, requiring scheduled service. Further, the handling of liquid nitrogen may be hazardous and undesirable in certain environments, such as clean rooms and remote locations.

It is known that a significant cause of detector failure is the gradual degradation of the vacuum in the evacuated space due to, e.g., internal out-gassing of the various component parts of the detector exposed to the vacuum and leakage from outside the evacuated envelope. In order to reduce outgassing of the component parts of the detector in the vacuum space during the service life of the detector, these component parts are generally prebaked in known manner in vacuo before assembly, and a general bakeout of the assembly is also carried out before mounting the detector electronic element(s). The excessive outgassing which generally occurs in X-ray and infrared detectors may be due to the fact that the gases cannot be driven out by baking the whole device during vacuum pumping (in the way which is usual for other vacuum devices) because X-ray or infrared detector elements are damaged at high temperatures.

This degeneration in the vacuum eventually leads to the situation in which a cooling element is no longer able (at least in an efficient manner or sufficiently fast) to cool the detector element to the desired temperature for efficient detection of the radiation. Thus, the detector lifetime is curtailed, especially as only limited cooling power is available to cool the detector. Furthermore, the outgassing into the vacuum space provides a significant thermal transfer path between the cold finger and the outside of the detector, when the pressure exceeds $1\_10^{-3}$ Torr. In mechanical cooling systems, the thermal capacity drops as the temperature differential increases, so that with an insufficient initial vacuum, necessary operating temperatures may never be reached.

The cooling system is generally not provided with an extraordinarily large cooling capacity because this may introduce increased vibration, leads to inefficiency and increased size, and may be difficult to control. In operation, the desired vacuum condition in the housing reduces the heat transfer from outside the vacuum space, thus limiting the amount of heat which must be removed through the cold finger. As the vacuum deteriorates, heat transfer from outside the space increases, imposing a greater heat load on the cryogenic system. Thus, the detector lifetime may be curtailed.

U.S. Pat. No. 3,851,173 describes one example of an infrared detector comprising an envelope, a cold finger in the envelope and at least one detector element mounted on an end of the cold finger so as to be cooled by the cold finger in operation of the detector. The envelope has an outer wall extending around the cold finger and an infrared-transmissive window facing the detector-element end of the cold finger. A space is present between the cold finger and the window and outer wall of the envelope, and a chemically-active getter is present in said space to getter gases from the space. The envelope of U.S. Pat. No. 3,851,173 is a vacuum Dewar having a vacuum space between inner and outer walls of the Dewar envelope. The inner wall defines an inner chamber accommodating a cryogenic cooling element which serves to cool the inner wall end and hence the detector element thereon, during operation of the detector. The cooled inner wall forms the cold finger of the detector. A major cause of infrared detector failure in designs of this type is the gradual degeneration of the vacuum in the space between the inner and outer walls due to internal out-gassing of the various component parts of the detector exposed to the vacuum. In the detector of U.S. Pat. No. 3,851,173 a non-evaporable chemically-active SAES getter unit is mounted in the outer wall to maintain a good vacuum in the space between the outer wall and the cold finger.

Another example of an infra-red radiation detector incorporating a getter to maintain a vacuum in a Dewar is described in U.S. Pat. No. 3,786,269. Its detector element array is cooled by a Stirling cycle refrigerator at approximately 50° K. In this particular detector a series of chemically active getters are mounted around the outer perimeter of the outer wall and protrude through into the vacuum space between the outer wall and the cold finger. In order to getter sufficiently large quantities of gas, such chemically active getters need to have a large surface area and are bulky; this can present a dimensional size problem in the spacing of the inner and outer walls and/or the shape of the outer wall.

Such chemical getters as employed in U.S. Pat. Nos. 3,851,173 and 3,786,269 are activated by being taken to a high temperature (for example 900° to 1,000° C.) during or after evacuating and sealing the Dewar envelope. This is normally achieved with an electrical heating element embedded in the getter material formed as a unit with electrical connection leads (not specifically shown in U.S. Pat. No. 3,851,173) passing through vacuum-tight seals in the Dewar. U.S. Pat. No. 4,206,354 shows an example of such a Dewar getter with its connection leads. For this reason the getter is mounted in the outer envelope wall with external electrical connections, and a large spacing is required between this type of getter and the detector element which could otherwise be damaged by the very high temperature. These factors lead to an increased size for the Dewar envelope and even the adoption of unconventional Dewar envelope outlines.

U.S. Pat. No. 5,177,364, incorporated herein by reference, discloses a cryogenic infrared detector system having a chemically-active getter present in an evacuated space to getter gases from the space. The getter comprises a porous layer of chemically-active getter material deposited on an inside surface area of the outer wall at a location separated from both the cold finger and the window. United Kingdom patent application GB-A-2,179,785 describes a pumping tubulation getter device for an electron discharge device such as a ring laser gyroscope. GB-A-2,179,785 describes the provision of the getter as an electrophoretically-deposited layer of porous sintered non-evaporable getter material selectively deposited on the internal surface of the pump tube through which the device is evacuated. Getter-free zones are present at each end on the internal surface of the tube. The getter is activated by HF induction heating of the tube. By locating the getter within the pump tube, space problems which otherwise arise in trying to accommodate a getter unit within the device chamber are avoided.

U.S. Pat. No. 5,235,817, incorporated herein by reference, discloses a radiation detector cryogenic cooling apparatus having a plurality of nested space thermally conductive elongated members having first and second ends. These nested tubes reduce thermal radiation parasitic input to the detector and cold finger, allowing higher efficiency and lower detector temperatures to be achieved. U.S. Pat. No. 5,274,237 relates to a cryogenically cooled radiation detector having means for preventing icing.

The use of molecular-sorbent porous bodies as getters is known. See, e.g., "Zeolite and Molecular Sieves" by D. W. Breck, John Wiley and Sons, Inc., New York, London and Sydney (1974) for a general background description of such porous molecular sorbents. It is known to use molecular-sieve getters in the form of loose beads or loose pellets retained behind a screen or in a cage. See, GB-A-921,273 which relates to liquefied gas storage containers and GB-A-1,192,897 which relates to circuit breakers. Molecular-sorbent getters are known to have increased sorption efficiency at cryogenic temperatures, unlike chemically active getters, which have increased sorption affinity at higher temperatures, e.g., about 300° K. and above.

Activated carbon molecular sorbent getter is known. See, e.g., Norit® activated carbon, Product Information Bulletin No. 206 (Rev. 1-91), from American Norit Company, Inc., incorporated herein by reference.

Activated carbon may be provided as granules or in shaped forms. Preshaped forms are provided either by pyrolizing a preformed organic material, which may be a polymer or organic mass, or by providing a binder for previously activated carbon powder. During pyrolysis, a properly selected organic material will undergo a predictable dimensional alteration; therefore a preformed organic material may be provided to pyrolize into the desired shape.

The getter of U.S. Pat No. 4,474,036 is, for example, a zeolite or synthetic zeolite material. The getter may also be a molecular sorbent material formed in situ, minimizing the need for adhesives, such as silica gel. This material is formed into a shape which conforms to a cooled portion of the vacuum space, such as around the cold finger, and is preferably not a loose granulate, because thermal transfer through such a material is retarded, and firm, thermally transmissive contact with the cooled portion of the Dewar cannot be assured. Therefore, the getter is generally provided as a formed element in substantial thermal contact with a cooled portion of the Dewar, such as by a low-outgassing epoxy. The epoxy may be filled with a thermally conductive material, such as silver powder. The getter is generally very fragile so that it is preferably supported by other structures. It is considered desirable in this application to effect reduction of the pressure in the evacuated space to less than about $1\_10^{-3}$ Torr in less than about 30 seconds after the time the getter is cooled.

Typically, the synthetic zeolite body of U.S. Pat. No. 4,474,036 is composed of particles having a width of at most a few micrometers and with somewhat irregular inter-particle voids also in the body. The pores of the porous zeolite particles forming the body have a width comparable to molecule sizes (up to approximately 0.5 nm) of gases in the vacuum space and were formed by driving off the water of crystallization of the zeolite material before molding the zeolite particles together in an annular shape to form the body; the heating required to effect this dehydration is thus performed before mounting the getter in the Dewar envelope. The resulting molecular-size pores permeate the zeolite particles to give an extremely large internal surface area, as a result of which the cooled body can absorb a large volume of gas by adsorption on the inner surfaces of the pores.

Since the cooling element of U.S. Pat. No. 4,474,036 is provided to cool to only a moderate cryogenic temperature, the good large-area thermal contact between the inner major surface of the getter body and the surface of the Dewar is particularly important in efficiently cooling the molecular-sieve body, i.e., the molecular sorbent getter, to obtain a high sorption efficiency. An annular configuration for both the getter body and the cooled surface also minimizes the amount of epoxy adhesive necessary to secure the getter body to the surface; this is important since a large amount of epoxy can increase out-gassing into the vacuum space. In a particular example the epoxy film may be typically 100 micrometers thick.

Molecular-sorbent getters do not require activation heating to very high temperatures after mounting in a vacuum space, so that the getter can be mounted in the proximity of the detector element so as to obtain maximum cooling of the molecular-sorbent porous body. A most efficient cooling of the shaped molecular-sorbent porous getter body can be achieved when the body is mounted around the inner wall of the detector Dewar in a vicinity where the inner wall is directly cooled by the cooling element. The shaped getter body or bodies of molecular-sorbent porous material may be bonded to an outer surface of the inner wall, and/or any other cooled surface associated with the inner wall. Thus, an annular radiation shield may be mounted at the end of the inner wall around the detector element, and the cooled surface to which at least one said shaped getter body is secured may be an outer surface of the radiation shield.

These molecular sorbent getters may be employed to reduce the effect of internal out-gassing in infrared detectors. Thus, it is known to provide at least one molecular-sorbent getter in a vacuum space of a housing for gettering gas molecules from this space. According to U.S. Pat No. 4,474,036, incorporated herein by reference, having an infra-red radiation detector mounted in an evacuated space with an infrared transmissive window, and cooled by a cold finger. U.S. Pat. No. 4,474,036 discloses the use of Joule-Thomson effect cooling for the cryogenic infrared detector system, e.g., by allowing a gas, such as dry air, nitrogen or argon, to expand in an area of lower pressure, absorbing heat. See also EP-A-0,006,297. In general, infrared detectors of the type employed in U.S. Pat. No. 4,474,036 are not especially sensitive to vibration and therefore the intrinsic vibrations from a Joule-Thomson cooling system did not require redress.

Cryogenic cooling apparatuses for cooling other types of radiation detectors to cryogenic temperatures are also known. For example, a radiation detector is employed with an electron microscope for detecting X-rays incident on a specimen being spectroscopically examined. Such X-ray detectors do not require an optically transparent window. The specimen is placed within the microscope and receives incident electron bombardment from the microscope. Scattered radiation from the specimen is then detected by a cryogenically cooled detector which converts the radiation to an electrical signal in a known manner for spectroscopic analysis. The detector is mounted on an elongated structure referred to in the art as a cold finger, extending to a position where it is desired to detect X-rays. The finger is cantilevered to a support so as to be placed within the region of the electron microscope adjacent to the specimen. The interior of the microscope and the region surrounding the cold finger are within an evacuated chamber. Cooling of the detector is accomplished by the finger which is thermally conductively connected to a source of cryogenic cooling, for example, a Dewar containing liquid nitrogen.

U.S. Pat. No. 5,337,572, incorporated herein by reference, relates to a closed cycle cryogenic refrigerator. This system employs a ternary mixture of gasses to allow a single stage compressor to achieve cooling temperatures of between about 65 and 150K, when used with a Joule-Thomson cryostat. U.S. Pat. No. 5,313,801 relates to a throttle valve for a cryostat, allowing automatic internal temperature regulation with a minimum of moving parts.

A Joule-Thomson cryostat operates by allowing an isenthalpic expansion of a medium, thereby cooling the medium. Therefore, a compressed refrigerant is provided to a flow restricting orifice. An expansion chamber is provided after the orifice, having a greater cross sectional area than the orifice. In general, a turbulent process occurs in the expansion chamber, producing vibration. Such a cryostat may operate with a liquified refrigerant, especially to obtain cryogenic temperatures. Such liquids generally expand supersonically and turbulently at the flow restricting orifice.

U.S. Pat. No. 4,910,399 discloses an electron microscope with an X-ray detector in an arrangement as described above. U.S. Pat. No. 3,864,570 also disclose an X-ray detector for use with an electron beam producing device disclosing a cold finger structure. British Pat. No. GB 2,192,091 discloses a still further embodiment of an electron microscope and cryogenically cooled X-ray detector system.

Typically in these kinds of systems, it is known to reduce heat input to the cold finger mounting the X-ray detector by using low emissivity warm surfaces and by wrapping the cold finger with low emissivity aluminized Mylar®. The heat to be extracted from the system comes from four sources. First, the X-ray detector system, including the detector crystal and electronics, generates an amount of heat in operation. Second, gas molecules in the evacuated space conduct heat to the detector and cold finger. Third, mechanical support structures bridging the cooled elements, i.e., the cryogenic cooler, the cold finger, and the detector assembly, and warm structures, i.e., the outer housing, conduct heat. Fourth, energy is radiated to the detector and cold finger, both heat energy from warm surfaces and energy from the operation of the apparatus, a portion of which is absorbed. At steady state temperature, the cold finger conducts the heat input along its length to the cooling system, and there is a temperature gradient between the radiation detector at the end of the cold finger and the heat sink of the cooling system. Care must be taken to minimize this gradient for acceptable performance. Additionally, the Mylar® and other organic compounds used in the insulation system present in the evacuated chamber in which the cold finger is secured may evolve contaminants undesirable when used in a ultra-high vacuum (UHV) environment.

In an electron microscope, a cavity of the electron microscope receives a specimen being examined by an electron beam produced by the microscope. The beam, typically less that 1 micron diameter, is incident on the specimen, producing X-rays which are then radiated from the specimen. The detector is placed within the microscope cavity adjacent to the specimen and detects the radiation emanating from the specimen. The detector, which includes a semiconductor detector for converting the X-ray signals to electrical impulses and a field effect transistor (FET) for sensing and amplifying the detected signal, produces an electrical signal which is passed to an external electronic circuit for analysis.

For example, one such X-ray detector system is disclosed in U.S. Pat. No. 4,931,650. In this environment the known detector comprises a semiconductor mounted at the end of the cold finger or probe introduced into the microscope close to the specimen. The cold finger is surrounded by an envelope and a vacuum is maintained between the finger and the envelope. The cavity in the microscope receiving the cold finger is also held at a vacuum. According to U.S. Pat. No. 4,931,650, a problem with X-ray detection in this apparatus is that it is sensitive to contamination and, especially, ice buildup. Moisture tends to accumulate on the detector, decreasing its effectiveness. This moisture may be removed and the performance of the detector improved by a warming-up procedure. Generally, prior art systems require that the system be disconnected for a period of time usually every few days or, in some cases, hours, so as to warm up the system and remove the accumulated moisture. The warming-up procedure involves pumping the detector to maintain a vacuum while removing water vapor as it evaporates. Such a procedure is used only as part of a major overhaul involving the return of the detector to the manufacturer. For windowless detectors, a warming-up procedure may involve using the vacuum pumping system of the electron microscope, which must maintain a vacuum during operation. In a windowed device for spectroscopy type examination, the cold finger is permanently maintained in its own evacuated housing. With liquid nitrogen cooling and sufficient getter material, an acceptable vacuum may be maintained for years.

In U.S. Pat. No. 4,886,240 a non-evacuated Dewar is disclosed which employs a molecular sieve that serves to absorb gases in the Dewar when cooled, for operation of a detector and to prevent liquid formation onto the detector. A desiccant also may be used to absorb moisture. The molecular sieve is employed for removing gases from the area adjacent to the detector when operating. Fluid contained within the cold finger expands, thereby absorbing thermal energy. The Dewar housing is back filled with inert gas such as nitrogen. This gas is at one atmosphere, e.g., at atmospheric pressure.

Known systems require the use of liquid nitrogen to achieve sufficiently low temperatures for high performance operation, e.g., cryogenic temperatures with low vibration for high resolution. Liquid nitrogen, however, is undesirable in certain applications, such as semiconductor clean rooms and remote lab sites. Peltier junction (thermoelectric) coolers have great difficulty in achieving sufficiently low temperatures for high performance operation. See, U.S. Pat. No. 5,075,555, which relates to a Peltier cooled lithium drifted X-ray spectrometer. Mechanical cooling systems, such as Stirling cycle refrigerators require complex mechanisms near the cold finger and may introduce vibrations.

Systems are known which attempt to actively damp vibrations. See Garba et al., "Piezoelectric Actuators on a Cold Finger", Technical Support Package, NASA Tech Brief 19(1) item 277, JPL New Technology Report NPO-19090, incorporated herein by reference. Such systems require at least one actuator for each axis of compensation and either a known predetermined vibration pattern or sensors to determine the vibration to be damped.

U.S. Pat. No. 5,225,677 relates to a protective coating for an X-ray detector. U.S. Pat. No. 5,268,578 relates to a specially shaped X-ray detector.

SUMMARY OF THE INVENTION

The present invention relates to a cryogenic radiation detection system having a radiation detector in an evacuated chamber in which the cryogenic condition is maintained by a closed cycle gas cryogenic cooling system. The detection system preferably includes an X-ray detector or other radiation detector, mounted on a cold finger in a vacuum. The cryogenic radiation detection system may be employed in energy dispersive radiation spectroscopy, e.g., X-ray spectrometry, elemental analysis in electron microscopy, X-ray fluorescence analysis and nuclear spectroscopic analysis.

In order to achieve the necessary cryogenic operating temperatures for the detecting unit, while employing an efficient cooling system, it is necessary to maintain a vacuum level of at most $1\_10^{-3}$ Torr inside the detecting unit. This vacuum level reduces the parasitic heat input to the system by substantially eliminating conduction through any gas in the detecting system cryostat. Available cryocoolers without this type of insulation will not reach operational temperatures at the detector cryostat necessary for low noise operation.

The closed cycle gas cryogenic system does not require a source of expendable liquid nitrogen, and allows use of a remotely located compressor/condenser unit. The compressor is preferably air-cooled and electrically operated, and supplies high pressure refrigerant to the detecting unit. The compressor/condenser is linked to the detecting unit by refrigerant supply and return lines. The compressed refrigerant from the supply line is at approximately room temperature. The compressed refrigerant is fed to a cryocooler in the detecting unit, where it is precooled by counterflow heat exchange from returning expanded refrigerant. An expansion chamber is provided in the cryocooler where the precooled compressed refrigerant is allowed to expand, where it absorbs heat and cools the surrounding mass, which is in thermal communication with the cold finger of the detector, which in turn cools the detector.

The cryogenic temperatures in the detecting unit are achieved by using a closed cycle, throttle valve regulated refrigerator. This device has basically no moving mechanical parts in proximity to the detector, and has low vibration characteristics at the detector end, when properly damped. The preferred cooler system is capable of cooling the detecting unit cold finger to approximately 100K at the detector crystal end, with a temperature stability of ±0.5K. A temperature responsive throttle valve is provided in the cryocooler to control the flow of compressed refrigerant into the expansion space. This throttle valve is self-regulating, controlling the refrigerant flow by the thermal expansion and contraction of an occlusive member acting as a needle valve. The refrigerant returning from the expansion space is provided in a conduit which flows antiparallel to the compressed gas entering the cryocooler unit. This exhaust refrigerant is cool, because the refrigerant in the expansion space is at about 80K, and therefore precools the entering compressed refrigerant to a low temperature. Under these temperature and pressure conditions, the compressed refrigerant near the throttle valve is mostly liquified. The counterflow heat exchanger has sufficient length so that the exhaust gas exiting from the counterflow heat exchanger is at about ambient temperature, thereby providing high efficiency. The preferred cryocooler has a thermal capacity of about 2 Watts when the thermally conductive member is about 82K.

The refrigerant may also be regulated in other manners, such as a piezoelectric valve, for example having a pulse modulated aperture leading to the expansion space. This allows more control over the valve operation, and may reduce turbulence-induced vibration at the detector when the valve is closed. Thus, readings under some circumstances may be taken in synchronization with low vibration intervals of operation. Of course, a synchronized reading method may be slower than a continuous reading method, and may best employed where reading throughput need not be maximized, such as where other time-constants of system inoperability are significantly larger than the valve modulation rate. A manual control valve may also be employed.

The detector is preferably a solid state semiconductor element interfaced with a field effect transistor (FET) amplifier circuit within the cryostat. At the detector crystal end of the housing assembly there is a thin window to allow X-rays to enter the detecting unit, while maintaining a vacuum. The thin window may be formed of, e.g., beryllium or thin polymer type materials. The solid state detector is maintained at cryogenic temperatures in order to reduce the electronic noise of the detector crystal and the FET.

The detector crystal and FET are mounted close together to one end the cold finger, which is a copper rod. The detector mount itself is preferably formed of aluminum. The other end of the cold finger, which is preferably formed of copper, is thermally connected to the cryocooler refrigeration unit. The cold finger is mechanically mounted within the cryostat by a temperature insulating support member affixed within the housing. A system is provided for the purpose of vibrationally isolating the cold finger from the cryocooler so that vibrations in and from the cryocooler are attenuated, thereby increasing the energy resolution of the detector.

When employing a lithium drifted silicon X-ray sensor, a temperature of about 100K to 110K at the detector crystal is desired. According to the present design, an internal mass damper has an operating temperature of about 82K, with a gradient along the cold finger and detector holder. Other types of detectors may have different optimum temperatures. For example, germanium detectors, which may detect X-rays and/or gamma rays, generally require a lower temperature, e.g., about 95K, for effective and efficient operation. In this case, a closed circuit cryocooler system is provided which produces lower temperatures, thus allowing reduced temperatures at the detector. Improved insulation techniques to reduce parasitic heat load may also reduce temperatures at the detector. The cryocooler may be operated with a refrigerant composition effective for cooling to temperatures lower than those achieved through the use of liquid nitrogen, which exists in a liquid state at standard pressure at 77K. For example, a cryocooler system similar to the system disclosed in U.S. Pat. No. 5,337,572, incorporated herein by reference, may be used to achieve minimum temperatures of less than 70K.

In order to reduce the thermally radiated heat input to the detector and cold finger, a cooled concentric tube about the cold finger may be employed to shunt heat radiated from the housing from the cold finger, in the manner of U.S. Pat. No. 5,235,817, incorporated herein by reference. This significantly reduces the parasitic heat load on the cold finger, reducing the temperatures achievable at the detector. Thus, the a cryocooler system according to the present invention allows the detector to operate at temperatures lower than those achieved with a liquid nitrogen Dewar. When a large amount of heat is input into a liquid nitrogen Dewar, vibration due to liquid nitrogen phase change becomes significant, and may couple to the electron microscope, reducing spatial resolution.

The supply and return lines link the compressor/condenser to the cryocooler. These lines are preferably formed of malleable copper tube, and may be of arbitrary length. Self sealing Aeroquip refrigerant couplings are provided to allow for easy connection and disconnection of the cryocooler from the compressor/condenser. The compressor continuously draws low-pressure refrigerant from the cooling system return line. The refrigerant is compressed, cooled and filtered by the compressor unit. The high-pressure gas also passes through an in-line gas filter on the system supply line to the cryocooler mounted in the detecting unit.

A pressure gauge mounted on the compressor indicates the return refrigerant pressure when the system is operating. The gauge also indicates equalization of pressure when the system is not running. A pressure relief valve is also preferably provided in the compressor housing to prevent operation at an unsafe pressure. A condenser is provided to remove the heat generated during compression. Because the system need only provide capacity for cooling the system from ambient temperature and then maintain operating temperatures, the compressor need not be extremely large. In practice, operating temperatures are reached in about three hours.

The cryocooler is subject to vibration from a number of sources. First, the refrigerant compressor produces a pulsatile pressure wave in the refrigerant streams, and also transmits vibration through the refrigerant supply and return lines. At the expansion chamber, the fluid refrigerant expands supersonically and turbulently, creating a noise and vibration. Further, the refrigerant vaporizes in the counterflow heat exchanger, creating the further possibility of vibration. The vibrations produced by an uncompensated cryocooler system exceed those produced by a liquid nitrogen Dewar cooling system. The uncompensated detector is vibration sensitive, resulting in an apparent loss of resolution. Therefore, the present invention employs methods for compensating for vibrations, i.e., attenuating vibration input to the detector or adjusting the detector output to eliminate the effects of vibration.

The cryocooler is physically connected to an internal mass damper with a plurality prestressed flexed copper members. These prestressed copper members provide a thermal communication path as well as mechanical support. The cryocooler is mounted to the housing. The internal mass damper is thus cooled by the cryocooler, and has a significant thermal inertia. Therefore, it is desired to have an internal mass damper with a high mass-to-thermal capacity ratio for faster responsiveness. The internal mass damper is further thermally linked to the cold finger by a flexed high-flexibility copper strap system having a number of straps of varying placement and orientation. The cold finger is mechanically supported in the housing by a separate low thermal conductivity member formed as a star of G-10 fiberglass reinforced epoxy material.

Thus, vibrations due to pulsation in the refrigerant flow, turbulence or mechanical vibrations transmitted in and along the refrigerant supply and return tubes are filtered from the detector. The inertial mass damper and cold finger assembly are vibration-isolated from the housing.

The evacuated space in the detecting unit is initially evacuated to a pressure of approximately $1\_10^{-7}$ Torr. This vacuum provides a clean environment for the detector crystal and FET and reduces heat convection to the cold finger by gas molecules. The operating parameters allow use of the detector until the internal pressure reaches about $1\_10^{-3}$ Torr, therefore providing a margin for vacuum degradation.

The present invention also provides an improved system for maintaining the functional integrity of the vacuum in the evacuated space, improving the ultimate performance of systems by achieving lower temperatures and by reducing electronic and mechanical noise characteristics.

The detecting unit is sealed at the factory, and does not require any external vacuum pumping during operation. It thus remains isolated from the external atmosphere, reducing the possibility of contamination of the detector or instrument. Therefore, according to one embodiment of the present invention, in order to maintain a high level of vacuum inside the detecting unit after sealing, a sufficient molecular sorption getter material is attached to a cold surface of the device to maintain molecular flow of gas molecules, e.g., a pressure of less than about 1 mTorr. Molecular sorption getter materials have the characteristic that, as cooled, they increasingly trap gasses from the cryostat, thus acting as an internal vacuum pump for the detecting unit. The total amount of gas that can be trapped by the getter material increases as the material gets colder and decreases as the ambient pressure drops. In such a system, the amount of clean getter material, its temperature and the amount of residual gas in the cryostat determine the operating pressure of the detecting unit.

In a closed cycle gas expansion refrigeration system, with a given refrigerant, mass flow rate and pressure drop in the expansion chamber, the final steady state temperature depends on the heat input to the system, which includes parasitic heat input as well as heat generated by any active components. During cool-down of the cryostat, the mass flow rate of the refrigerant is reduced by reducing the throttle aperture to the expansion chamber as the temperature drops. This throttle valve is preferably a temperature-responsive needle valve. This reduction in flow rate increases the pressure and temperature drop of the fluid across the aperture as the temperature decreases. This reduction in refrigerant flow rate, however, also reduces the heat capacity of the system. In order for the system to continue cooling, the total heat input to the system must be lower than the heat capacity of the cooler at the current temperature.

When operating at steady state, the heat capacity of the cryogenic cooling system is balanced with the heat input to the system. Therefore, the system is designed to reach a target temperature based on the heat of operation of the device and the parasitic heat input to the system. Therefore, the system preferably has a low and constant parasitic heat input so that the device operates stably over extended periods of time.

It is noted that hybrid cooling systems may be provided, combining Joule-Thomson. Peltier, volatilizing gas, Stirling cycle cooling and other known cooling methods.

The getter material in the detecting unit must be clean enough and of sufficient quantity to assure that the conducted heat input through the residual gas, in combination with other sources of heat, is always lower than the heat capacity of the refrigerant unit. This holds true until the cryostat pressures of less than about $1\_10^{-3}$ Torr are achieved. This pressure marks the delineation between viscous and molecular gas flow and is the practical limit at which heat conduction through the residual gas is significant. An appropriate amount of clean getter material will allow the unit to achieve vacuum levels of less than about $1\_10^{-3}$ Torr quickly, assuring that the cryocooler will achieve the desired operating temperature range.

The molecular sorption getter is preferably formed to occupy void space adjacent to cooled surfaces inside the evacuated space. However, the getter may also be provided as a plurality small portions mechanically retained against the cooled surfaces.

Activated carbon is a preferred getter material, and may be generated from preformed organic material which is converted to activated carbon while retaining its form. Thus, an easily formed organic material such as a polymer or biological material is pyrolyzed or processed into activated carbon which less easily shaped.

According to a further embodiment according to the present invention, an electrically insulating gas conduit is provided in the gas supply and return lines to insulate the ground of the detecting unit electronics from the ground of the cryocooler compressor. Proper operation of the detector requires isolation of the detector electronics from the compressor system.

Failure to isolate the detector results in statistical noise, much as vibration results in statistical noise, resulting in reduced low level sensitivity and increased peak width, important qualities of the detector. See, *Quantitative X-ray Spectrometry*, Jenkins et al., Marcel Dekker, Inc., pp. 144–147; *Scanning Electron Microscopy and X-Ray Microanalysis*, Goldstein et al., (2nd Ed.) Plenum Press (1992), pp. 310–393.

According to standard practice, flexible conductive metal gas supply lines are employed to contain the pressure and ensure leak free performance and impermeability to refrigerant gas and water. According to the present invention, a glass or ceramic, or other type of pressure stable high pressure containment conduit, formed as a short tube, is placed in line with the supply and return gas line, thus electrically isolating the detector while containing the refrigerant gas. A preferred material is Macor®, a mica filled composition.

Various interfering factors, such as vibration and electrical interference, act to increase the FWHM of the output signal from the preamplifier FET from less than or equal to about 137 eV at 5.9 keV from $^{55}$Fe at 1000 cps with a 40 µS time constant to a greater value, e.g., greater than about 140 eV. The interfering factors convolve with the signal produced by an X-ray to increase the FWHM. See, Goldstein, J. I., et al., *Scanning Electron Microscopy and X-Ray Microanalysis* (2d Ed.), Plenum Press, New York (1992), pp. 310–313. As the peak width increases, the ability to distinguish closely spaced peaks diminishes.

There are a number of methods available for reducing the effective vibration sensitivity of the detector other than passively damping the vibration. First, a compensating detector crystal subject to nearly identical vibrational variation, and not subject to an unknown X-ray radiation may be used in a differential amplifier circuit. Second, an active damping system may be provided which uses actuators, e.g., piezoelectric actuators in proximity to the cold finger or detector, to actively suppress vibration at the detector, based on a measured vibration pattern. Third, an accelerometer may be provided, such as a micromachined sensor, which measures the acceleration forces to which the detector is subject. The accelerometer output is then used to compensate the detector output. Other types of vibration sensors may also be employed.

It is believed that one component of vibration sensitivity is related to a relative movement between mechanical structures of various high sensitivity electronic elements held at various potentials, such as the FET gate, and ground planes. The front face of the detector crystal is held about 750 V from ground, in order to sweep charge from the detector crystal to the gate of the FET for measurement. Thus, vibrations may affect capacitance to ground and induce gain changes in the FET, leading to loss of output resolution. Therefore, sensitivity to vibration of these structures may be reduced by shielding with a guard ring driven to approximately the same potential as the sensitive structures or shielding with a shield mechanically fixed to the structure. The movements of these charged structures may also be detected electrometrically for compensation of the output of the detector amplifier.

Vibration may also be directly measured. For example, the Analog Devices ADXL05, having a minimum sensitivity of 5 mg, or similar device, may be employed to detect vibration for compensation. Other types of acceleration or vibration sensors may also be used, to measure the vibration of the detector or a surrogate element which has a determinable vibrational-relation to the detector.

The closed circuit cryogenic cooler, without damping, produces an unacceptable level of vibration, e.g., about 7.4 mg RMS, over a frequency range of 0–500 Hz, along the long axis of the cold finger. When two 27.75 lb steel blocks are placed on the refrigerant tubes between the compressor and the cryocooler, the level is reduced to about 6.5 mg RMS. When a 13 lb lead ring is placed around the housing of the cryocooler, the vibration levels are reduced to about 4.5 mg RMS. When both the steel block and the lead ring are employed, the vibration levels are reduced to about 3.2 mg RMS.

As constructed into a cryogenic radiation detector according to a preferred embodiment of the invention, with external mass damping of the refrigerant supply and return lines and internal inertial mass damping, the system produces 3.5 mg RMS from 0–2 kHz along the X axis (long axis), 1 mg RMS along the Y axis and 1.3 mg RMS along the Z axis. A comparable 10 liter liquid nitrogen cooled Dewar system produces 0.4 mg RMS from 0–2 kHz along the X axis (long axis), and around 0.5 mg RMS along the Y and Z axes. With this level of vibration damping, energy resolutions of less than or equal to 137 eV at 5.9 keV from an $^{55}$Fe source, 1000 cps with a 40 μS time constant can be obtained with a lithium drifted silicon crystal detector according to the present invention. Without such damping, the energy resolution would be at minimum about 140 eV, and likely greater than about 150 eV under the same conditions, which results in an inferior instrument.

As shown in FIG. 1, three X-ray peaks 61, 62, 63 are emitted from a sample. Due to characteristics of the detector system, vibration, electrical interference, and other sources of noise, the energies as received are dispersed to a received signal having a greater FWHM 64, 65, 66. The detector, because of the closeness of these peaks, receives a signal which appears like signal 67, and has difficulty resolving the individual peaks 64, 65, 66. Further, as the peaks are spread, the intensity is decreased, and the signal-to-noise ratio decreased. The X-ray peaks 61, 62, 63 emitted from a sample have a FWHM of about 2 to 3 eV. The detector and associated electronic circuit, however, spreads the energy over a wider range. For example, a liquid nitrogen cooled Dewar system having a lithium drifted silicon crystal operating at about 100–110K has a peak width of about 137 eV using a standard measurement technique, measurement of a 5.9 keV X-ray from an $^{55}$Fe source, 1000 cps with a 40 μS time constant (Si(Li) crystal detector). As stated above, this peak is broadened by vibration, high temperatures, and other factors known in the art.

In order to reduce the effects of external disturbances on the X-ray detector crystal, three general methods are theoretically available. First, the external disturbances may be filtered, attenuated, shielded or other wise blocked. Second, the sensor may be made intrinsically selective or more selective for the environmental variable of interest, e.g., X-ray radiation. Finally, the sensor output may be compensated for the effects of environmental variables other than the variable of interest. The second method is the province of sensor design proper, and is not the subject of the present invention, except insofar as the selectivity of the sensor is interrelated with the filtering of interfering environmental influences.

In the present case, the external influence of most concern is vibration. This vibration is derived from two general sources: the compressor, which has reciprocating elements which produce a mechanical vibration as well as a pressure pulsation in the refrigerant lines, and the cryocooler, which is subject to turbulent flow and expansion of refrigerant. In order to reduce mechanical vibration from the compressor, the compressor may be dynamically balanced and otherwise isolated and mounted to reduce vibration which is transmitted along the supply tubing or the refrigerant itself. Pressure pulsations in the refrigerant tubing may be filtered with resonators, bleed valves, pressure relief valves, compliant conduits and other known methods.

As stated above, vibrational energy which remains, may be damped by providing a large mass damper firmly linked to the refrigerant tubing. Vibrations passing the linkage are attenuated. The turbulent vibration is generated in the cryocooler proper, and therefore may not be easily filtered in the refrigerant lines. In order to attenuate vibrations generated in the cryocooler, an active or passive mechanical filter is provided at the cryocooler or between the cryocooler and the detector crystal. Passive filters include damping elements, which convert vibrations to other forms of energy. Active filters determine a force of a vibrational wave and apply an opposing force which sums with the vibrational wave, resulting in an attenuated waveform, at least in a particular region of interest, i.e., the detector. Since a complex mechanical structure bridges the cryocooler to the X-ray detector crystal, care may be taken to reduce undesired resonances and other detrimental acoustic or vibrational properties of the structure.

Depending on the wave source and its coupling to the mechanical structure, the vibrational wave may have compression wave and shear wave components. These components are dispersive, and may be filtered separately in terms of eliminating their effect on the X-ray sensor.

According to one embodiment, a thermally conductive viscous fluid is provided in a compliant conduit as a link between the cryocooler and the detector. This fluid may be, e.g., a vacuum oil, such as a light silicone oil. This fluid should have a viscosity such that shear waves are substantially attenuated by the fluid. The compliant conduit is such that the conduit wall itself does not substantially support significant vibration transmission and the compliance is sufficient to attenuate compressive waves in the fluid. The fluid is thermally conductive so that the detector is effectively cooled. The fluid may also support a convection current to reduce the thermal gradient along the conduit, in the manner of a heat pipe. When a heat pipe configuration is employed, a phase change fluid medium may be employed, which has a higher vapor pressure at an end proximal to the detector than at the other end proximal to the cryocooler.

While it is preferred that the amount of vibrational energy that reaches the X-ray detector crystal be minimized, if an output compensation system is also employed, it is also desired that any mechanical hysteresis effects be minimized and sources thereof eliminated between a point where a vibrational measurement may be obtained and the detector, even if this results in a somewhat greater amplitude vibration at the detector crystal. This is because an electronic vibration compensation system requires a well characterized and repeatable effect of measured variables on the output of the sensor, which is not possible with hysteresis effects present. Thus, for example, where a vibrational detector is mounted external to the evacuated chamber, and the vibration at the housing is presumed to correlate with the vibration at the detector crystal, all intervening sources of hysteresis should be minimized. Where a vibrational detector detects a vibration in the cold finger, damping systems which allow hysteresis located between the vibrational detector and the cryocooler are permissible.

For example, an optical interferometry technique may be employed, using a source of polarized, coherent light, which is transmitted from a known position such as a point on the inside of the evacuated housing, through the evacuated space, and incident on a portion of the vibrating assembly, which is reflected to a receiving system to measure a displacement of the portion based on an interference pattern, thereby indicating the second integral of the vibrational force. The optical paths may include fiber optics. Since this measured portion of the interferometer system may be placed close to or on the detector crystal, the mechanical limitations on the support structure are minimized. Multiple optical paths may be provided to compensate for different degrees of freedom.

Likewise, a magnet, e.g., a high temperature superconductor magnet, may be mounted in close proximity to the detector crystal, and an electrical circuit provided to induce a magnetic field. A Hall effect transducer or other type magnetometer mounted on the housing in proximity to the magnet will produce a waveform which corresponds to the movement of the magnet with respect to the Hall effect transducer. High temperature superconductors may also be used as part of a magnetic bearing system to isolate the detector from vibration. Therefore, the cryogenic temperatures near the detector may advantageously be used to cool high temperature superconductors, useful as a part of sensors, actuators and isolators.

Another source of the vibration sensitivity of the X-ray detector crystal is the variation in distance or pressure applied by the contact between the FET gate electrode and the rear face of the detector crystal. Thus, this force may be detected directly by a transducer on this contact, such as a strain gage, or by mounting a relative displacement sensor between the FET and the X-ray detector crystal. Such a relative displacement detector may also be an interferometric or optical, magnetic, inductive, resistive, piezoelectric, or other known types. It is preferred that the only contact to the detector crystal be the contact for the FET, which is preferably a flexed beryllium copper spring contact, so that the vibration measuring system should be of a non-contact design or measure the contact itself. A vibrational sensor may also be placed on or near the detector crystal.

In order to output compensate the detector crystal, the relation of a vibration to an alteration of the output of the crystal is determined. After determining the effect of vibration on the detector, it is only necessary to determine the vibration at the detector to compensate the output. This may be explicitly measured, or determined empirically. Thus, a particular force or force waveform may be determined to have a particular effect on the output, so that by measuring the vibrational force, a direct output correction may be made. Alternatively, a neural network may be trained using one or more radiation standards, which allows the relationship between a detected vibration and the output to be determined and compensated, based on a series of stored coefficients and a related topology. In such output compensation systems, the compensation need not be limited to vibration only, and in fact any measured variable may be compensated in like manner. Further, any non-linearities in the sensors may advantageously be compensated by a neural network compensation scheme.

The compensation system may have a high computational complexity. For this purpose, a digital signal processor or dedicated neural network processor may be employed to completely or partially process the transducer signals. Where the mechanical system is complex, such as where vibrational transducers are mounted on the housing, and the vibration of many mechanical elements must be compensated, a mathematical model of the system may be formulated to allow determination of a relevant vibration of the sensitive structure. A separate compensation may then be applied using the measured detector output and the determined vibration to produce a compensated output. Where this model is fully mathematically determined, it may be preferable to employ a mathematical processor, such as a digital signal processor or floating point processor to calculate the model equations. On the other hand, where the model is not mathematically determined, a neural network processor may be used to infer a vibration of the crystal based on measured vibrations. A parallel processing system, e.g., parallel Intel Pentium processors, Power PC, TI 32C080 (MVP) or other RISC, CISC or DSP processors, may also be employed.

Another factor that may increase the signal spreading of the sensor is electrical currents through the structure. These may be related to varying electrical or magnetic fields, ground loops, leakage or the influence of other devices. These signal spreading influences may be reduced by electrically insulating the sensor system from external systems. In addition, external electrical signals may be measured and compensated.

In order to insulate the sensor system, insulating conduits may be provided to isolate the compressor system from the sensor system. An insulating conduit is joined to conductive metal tubing from the compressor, which is, e.g., copper tubing, by stainless steel couplings which are connected to the insulating material at a leak-tight brazed joint. A metal collar, which may be stainless steel, is brazed to the insulating conduit with a standard brazing compound, to form a tight seal and a firm mechanical connection. The stainless steel couplings are held by the brazed collars, and allow connection to the supply and return tubing in standard manner on both sides. A quick-release coupling of standard type, e.g., available from Aeroquip, may be provided integral to the insulating conduit apparatus, or as a separate connector. The preferred insulating conduit is formed of Macor®, a mica-filled ceramic-type material having good fabrication properties.

BRIEF DESCRIPTION OF THE DRAWINGS

These and other features in accordance with the invention are illustrated, by way of example, in specific embodiments of the invention now to be described with reference to the accompanying drawings, in which.

Figure 1:
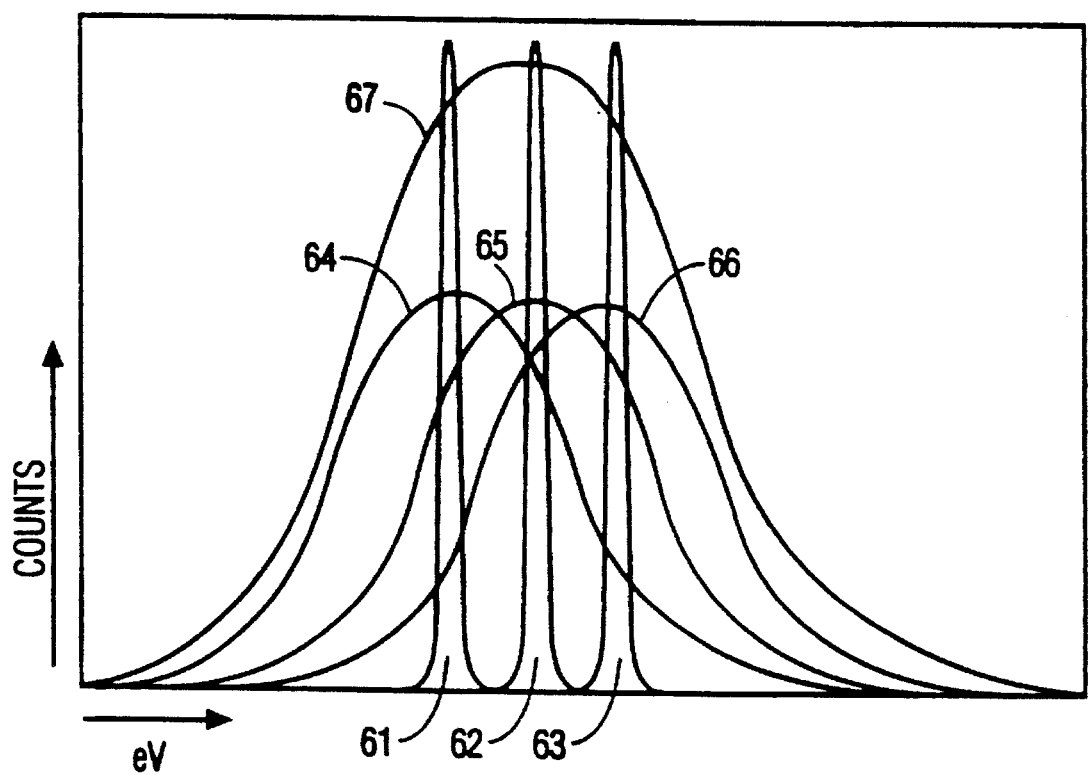
FIG. 1 is a graph showing the influence of peak spreading on the detector performance.

It should be noted that these Figures are not drawn to scale, and the relative dimensions and proportions of some pans have been greatly exaggerated or reduced for the sake of clarity and convenience in the drawing. Furthermore, some pans of the cryogenic radiation detector which it are not necessary to describe for an understanding of how to perform the present invention have not been shown in the drawings, but may be provided in known manner.

DETAILED DESCRIPTION OF THE PREFERRED EMBODIMENTS

EXAMPLE 1

Figure 2:
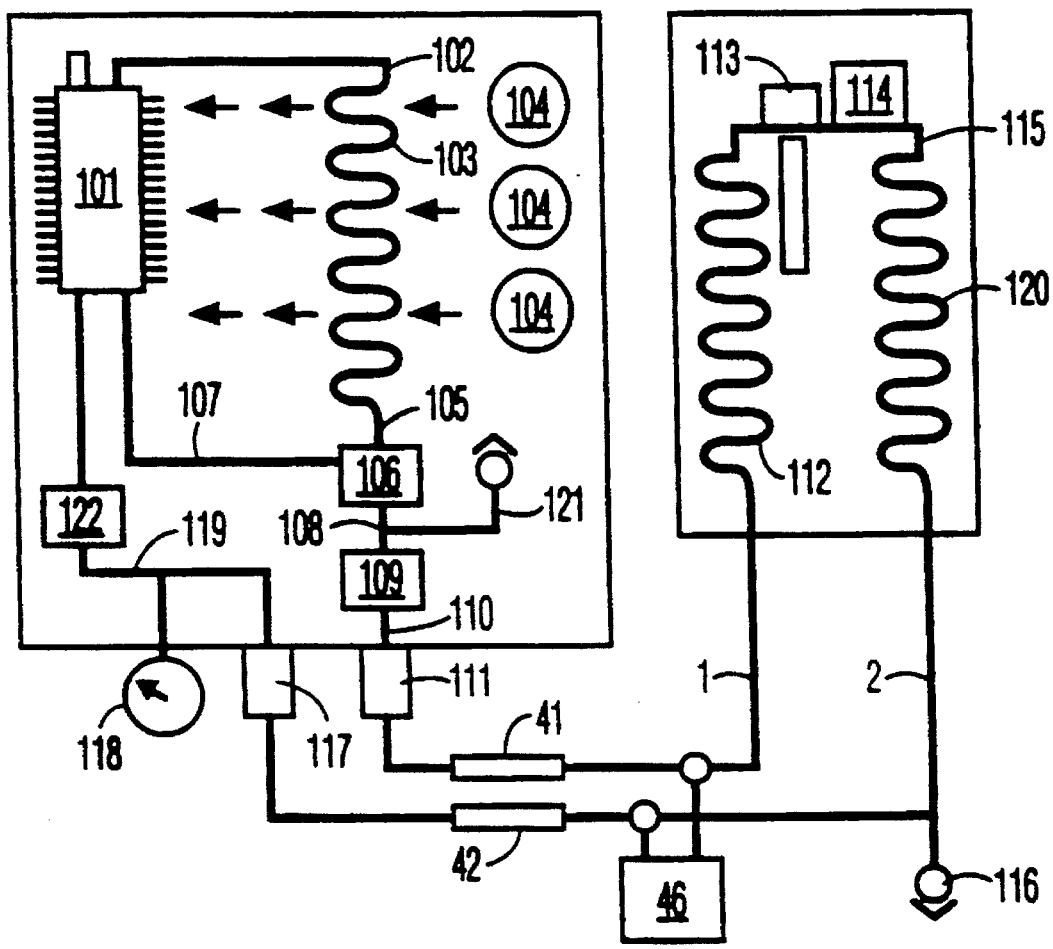
FIG. 2 is a block diagram of a closed circuit cooler employed for achieving cryogenic temperatures.
Figure 3A:
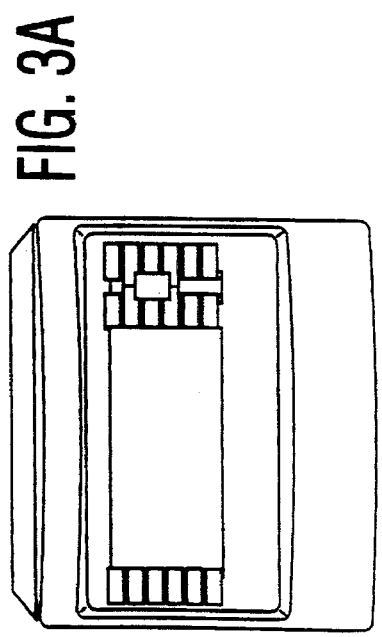
FIG. 3a shows a front view of the compressor.
Figure 3B:
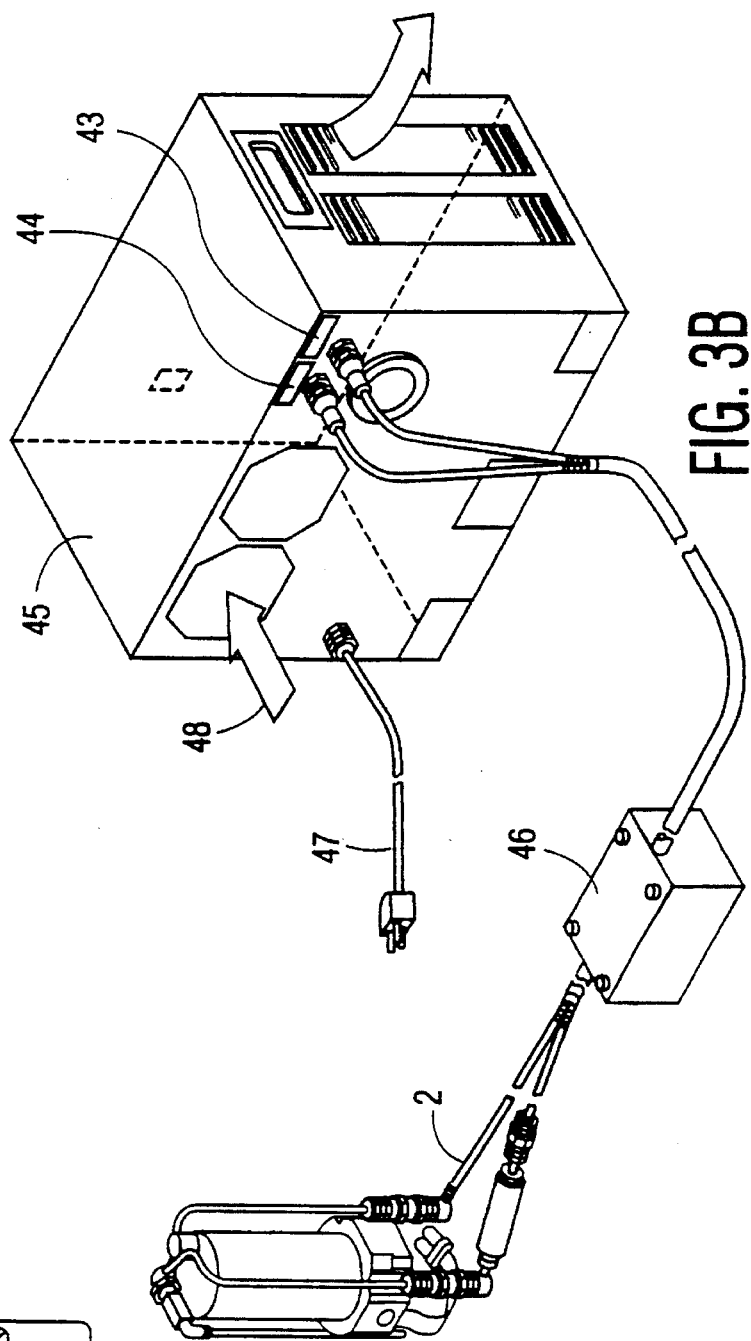
FIG. 3b is a perspective view of a closed circuit cryogenic cooler according to the present invention having an external damping mass.
Figure 5:
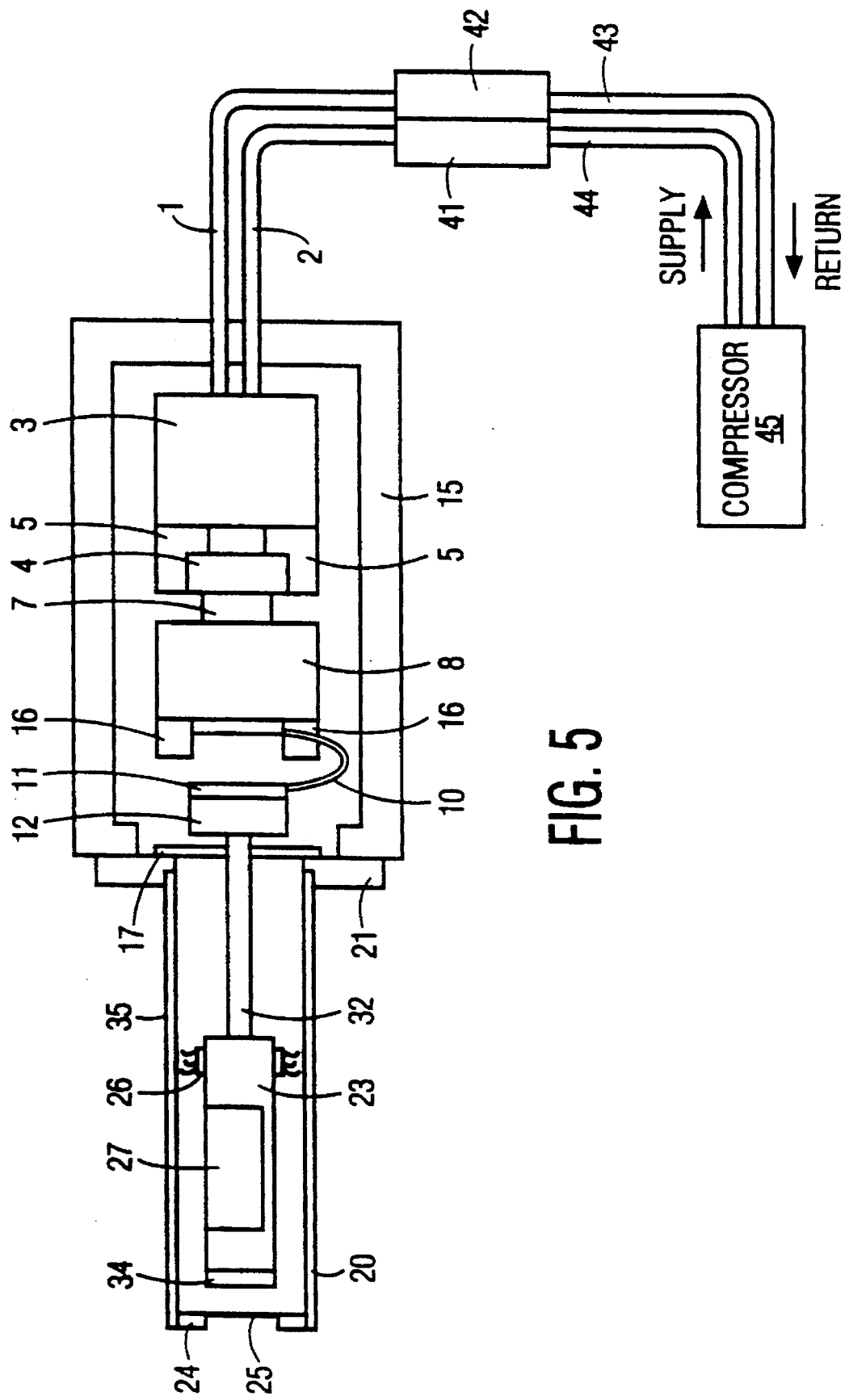
FIG. 5 is a cross-sectional view of an X-ray radiation detector in accordance with a second embodiment of the present invention, having added getter material.

The operation and use of the device of Example 1, shown in FIGS. 2, 3 and 5 is described in "CryoX (TM) Service Manual", EDAX, Rev. 1, March 1995, attached hereto as an appendix and incorporated herein by reference.

Figure 9:
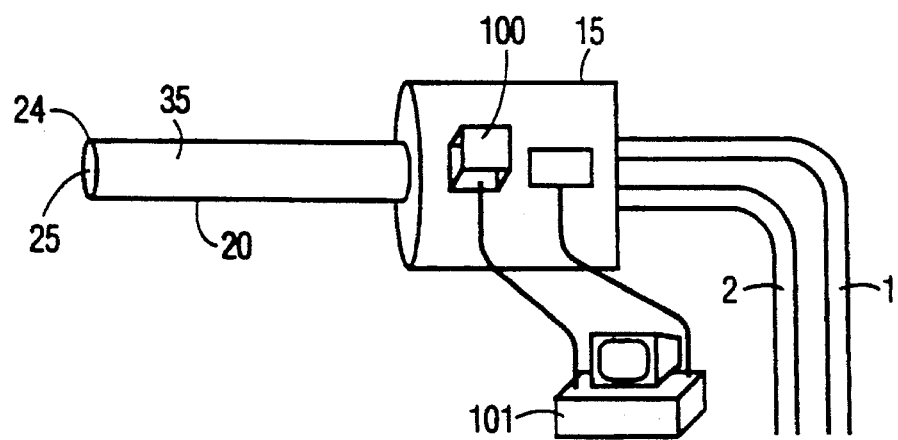
FIG. 9 is a perspective view of an X-ray detector having an external vibration sensor.

In FIG. 9 cryogenic cooling system gas supply having a compressor 101, a heat exchanger 103 for cooling the compressed gas, also known as a condenser are provided. The compressor is electrically powered, preferably from line current through a line cord 47, shown in FIG. 3. The heat exchanger 103 is provided with a high surface area radiator portion which has a high heat transfer coefficient between an internal volume of compressed gas and a stream of air 48 forced over the portion by blowers 104.

The cryogenic cooling system has a supply tube 1, from a coupling 111, which feeds a stream of compressed refrigerant at approximately ambient temperature. A return tube 117 is provided to recycle the gas through the system from the cryocooler 120.

The heat exchanger 103 may be a gas-to-fluid type, and the cryogenic cooling system may be an open circuit or operate off a tank of compressed refrigerant gas with a pressure regulator. Secondary cooling systems may also be employed. Other types of compressed gas supplies are known, and may be used in accordance with the teachings of the invention.

A pressure relief valve 121 is provided in the supply line to prevent overpressure conditions. A supply line gas filter 109 and a return line gas filter 122 is are provided to reduce particulate contamination. A pressure gauge 118 is provided to indicate line equalization, and a pressure relief valve 116 is also provided in the return line proximate to the cryocooler.

The compressor employs an oil lubricant, and thus includes an oil separator 106, and oil return line 107.

As shown diagrammatically in FIG. 2, the cryocooler operates on a standard Joule-Thomson principal, with a counterflow heat exchanger for precooling the compressed refrigerant in the supply path 112 with the expanded refrigerant in the return path 120. The compressed refrigerant is present in a mostly liquified state at the end of the counterflow heat exchanger. A throttle valve 113 is provided to limit refrigerant flow into the expansion chamber 114, where the pressure drop in the gas flowing through the orifice occurs supersonically and isenthalpically so that the refrigerant experiences a temperature reduction, in accordance with the Joule-Thomson principle. The refrigerant flow in the expansion chamber is turbulent.

An external mass damper 46, formed of a steel block having a weight sufficient to damp compressor induced vibrations, e.g., greater than about 20 lbs., is provided firmly connected to the supply 43 and return 44 lines and resting on the floor to reduce any pulsatile variation in the refrigerant tubes.

Other types of refrigerant line vibration damping may be provided in known manner, e.g., to provide a constant pressure supply with low ripple. A further pressure fluctuation filtering may be effected by selectively venting a portion of the compressed refrigerant gas supply to the return line, in order to effect pressure fluctuation filtering of the supply line. A resonator may also be employed to damp vibration of predetermined frequencies.

The output of the supply line from the external mass damper 1 leads to the cryogenic refrigerator of the radiation detector device. As stated above, the cryogenic refrigerator includes a counterflow heat exchanger 3 which precools the compressed supply refrigerant to an almost liquid state with the returning expanded refrigerant. The expanded refrigerant vaporizes in the counterflow heat exchanger 3. The precooled pressurized supply refrigerant passes through a throttle valve 113, which selectively restricts the flow of refrigerant into an expansion chamber 114. The throttle 113 valve includes a needle, having a portion which extends into the expansion chamber, with an expanded neck portion which is proximate to a conical valve seat (not shown). As the expansion chamber 114 cools, the needle contracts, causing the expanded neck to restrict refrigerant flow by partially seating in the conical valve seat. In general, the throttle valve 113 is more open during cool down, where the cryogenic cooling system has a greater cooling capacity, but reaches a higher minimum temperature because of the increased back pressure in the expansion chamber. After the system reaches a target temperature, the throttle valve 113 is less open, so that the flow rate is reduced and the pressure differential between the compressed refrigerant supply 112 and the expansion chamber 114 is increased. This decreases the theoretical minimum temperature while having the effect of reducing the heat removal capacity of the system. This type of control helps to achieve cool down rapidly, while providing integral temperature regulation.

Figure 4:
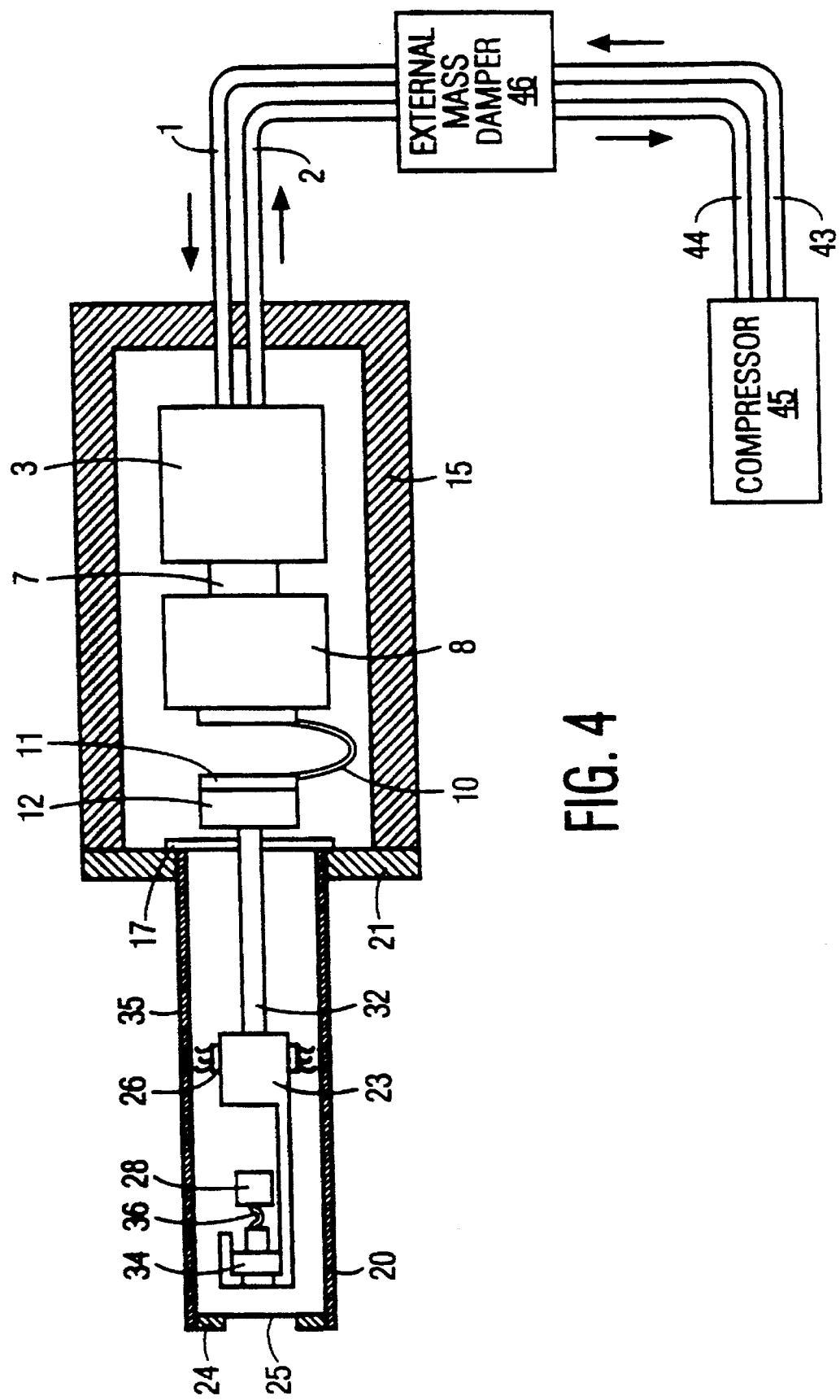
FIG. 4 is a cross-sectional view of an X-ray radiation detector in accordance with a first embodiment according to the present invention.

As shown in FIG. 4, The cryogenic refrigerator and the cooled components of the detector are contained within an evacuated chamber 15, 20, 21, 25. The vacuum reduces the thermal conduction through a surrounding gas to the outside, which is, e.g., at ambient temperature. The evacuated chamber 15, 20, 21, 25 is initially brought, during manufacture, to a vacuum pressure of about $1\_10^{-7}$ Torr. This allows an amount of degradation of the vacuum, to about $1\_10^{-3}$ Torr (operating), before the thermal transfer through the gas in the envelope becomes limiting, and the gas tends to be less molecular and more viscous in its characteristics. This degradation of the vacuum may occur due to, e.g., outgassing of the detector or diffusion through seals. Since the evacuated chamber is sealed, degradation of the vacuum limits the operating life of the detector before repair or replacement. The housing is sealed using a single hard seal, available from Helicoflex (not shown).

Therefore, low outgassing components are employed in the construction of the device. Components are baked under vacuum during final assembly at least 150 F for at least 24 hours to eliminate as much residual gas as possible and to minimize later outgassing. The detector crystal 34 and electronics 28, including the FET, cannot be baked at high temperatures, and thus are a major source of outgassing in the final assembly.

The expansion chamber 114 of the cryogenic refrigerator is linked in thermal communication to an internal mass damper 8, provided in order to reduce vibration transmitted to the radiation detector 34. This internal mass damper 8 reduces vibration transmitted through the refrigerant supply 1 and return 2 lines, as well as any vibration from turbulence, resonance or other vibration from the expansion chamber 4. The internal mass damper 8 may also reduce mechanical coupling from external vibration in the supply 1 and return 2 lines to the detector system. The internal mass damper 8 is a copper cylinder weighing about 2 lbs. Vibrations reduce the resolution of the detector 34 and may create microphonics in the output signal.

Figure 6:
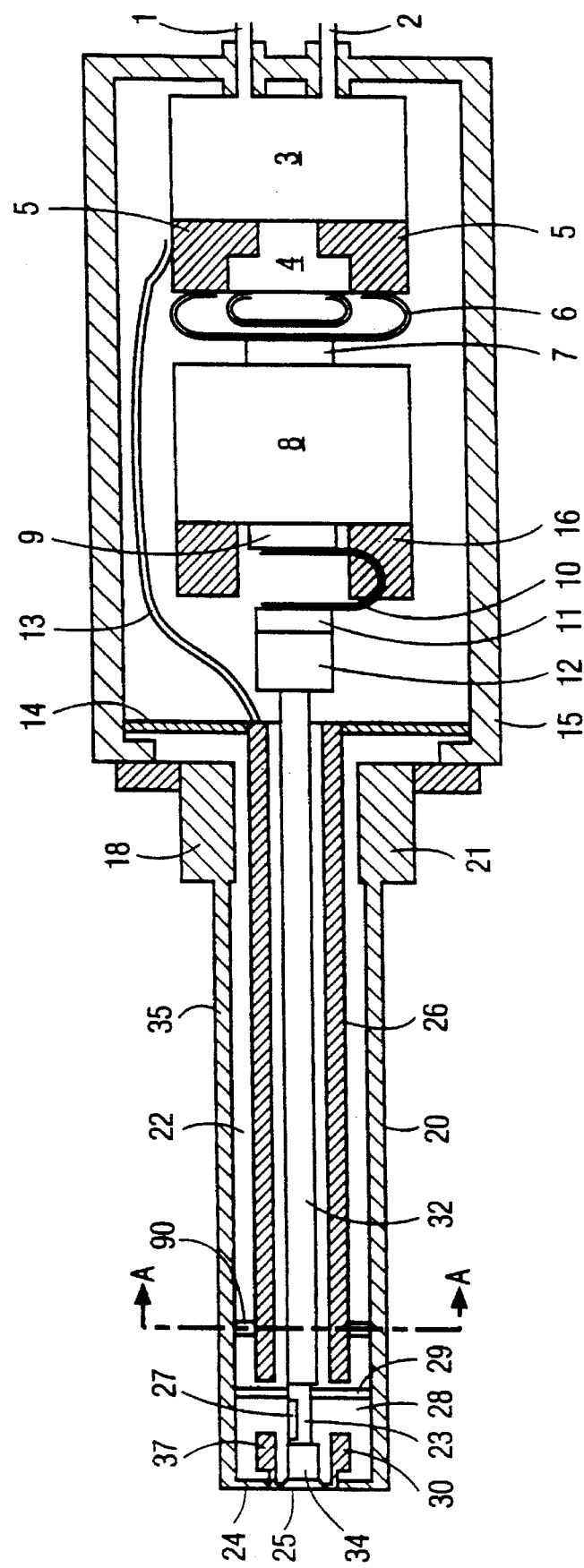
FIG. 6 is a cross sectional view of an X-ray radiation detector in accordance with a third embodiment of the present invention, having a cold tube circumjacent the cold finger.

The cryocooler 3 is mechanically and thermally linked to the internal mass damper 8 by a plurality prestressed flexible copper straps 6, shown in FIG. 6, which are flexed in position. This connection serves to allow the internal mass damper 8 to attenuate vibrations from the cryocooler 3, while acting as a thermal conduit. These preflexed flexible copper straps 6 also serve to mechanically support the internal mass damper 8.

The internal mass damper 8 is linked to a flexible thermal coupling 10 to the cold finger 32. This flexible thermal coupling 10 consists of a plurality of flexible braided copper webs, which are flexed to provide maximum compliance along the axis of the cold finger 32. The cold finger 32 is thus supported separately from the cryocooler 3, as the flexible thermal coupling 10 between the internal inertial mass damper 8 and the cold finger 32 does not provide stiff mechanical support. The flexible thermal coupling 10, however, cannot be formed with sufficient flexibility to provide sufficient vibration isolation, and therefore it alone is insufficient to vibration isolate the detector 34.

The cold finger 32, which is preferably formed of copper, is concentrically secured within an extension of the envelope 35 from the cryocooler 3 and internal mass damper 8 by a thermally insulating disk 17. The thermally insulating disk 17 preferably is formed of G-10 fiberglass reinforced epoxy. Near the detector, a further spacing support is provided as a strip of Velcro® fastener hook portion 26 about 0.25 inch wide, wrapped circumferentially around the detector holder 23, which centers the detector holder 23 in the extension of the envelope 35.

Other materials, e.g., a fluorocarbon plastic commercially available as a polychlorotrifluoroethylene or PCTFE, (Kel-f®) may also be used. The thermally insulating disk 17 for the cold finger has radially directed members in a star formation to reduce the heat conduction path cross sectional area. The cold finger 32 may be supported, if necessary, by a number of insulating disks 17, spaced along the length of the cold finger 32.

The cold finger 32 is a circular cylindrical copper cylinder which is preferably about 0.250 inches in outside diameter and is at a temperature of less than about 100K with a temperature gradient from end to end. The cold finger 32 has a polished external surface that has a specular finish to provide a relatively low emissivity factor, for example, around 0.1. This low emissivity minimizes radiation coupling of the cold finger 32 to the housing members 35, 21, 15, which radiation coupling is the major source of heat transfer. The cold finger 32 is then wrapped in aluminized Mylar® sheet.

The cryogenically cooled detector assembly is part of an X-ray spectrometer, which may be mounted to an electron microscope chamber. The microscope chamber may be evacuated, drawn to, for example, $1\_10^{-6}$ to $1\_10^{-5}$ Torr. A specimen is located within a microscope chamber and is located in the path of an electron beam of the microscope. An electron beam is incident on the specimen and emits X-rays of particular energies at particular angles. These radiated X-rays are received by the detector assembly. The detector may be moved with respect to the sample, to collect data relating to X-ray emission at differing orientations.

A radiation detector holder 23 assembly is thermally conductively secured to the cold finger 32. This radiation detector holder 23 is preferably formed of aluminum. The extension of the envelope 35 has a thin, X-ray radiation transparent window 25 formed at an end thereof. This window 25 is sealed, so that the vacuum within the housing is maintained.

The radiation detector holder 23 assembly holds an X-ray detector crystal 34, which is preferably a lithium drifted silicon X-ray detector, as known in the art. The preferred size is 10 mm². This crystal detector 34 operates with an externally generated bias voltage, to sweep the induced charge to the gate of a FET 28. A wire conductor couples the sleeve to a source of bias voltage (not shown) for biasing detector. The FET is electrically and mechanically coupled to the detector crystal by a beryllium-copper spring 36, which resiliently holds the detector crystal 34 in place. The electrical output from the FET amplifier circuit is a thin wire which exits from the envelope for connection to other electronic circuits (not shown).

The radiation detector holder 23 assembly also supports other portions of a field effect transistor (FET) electrical amplification circuit (not shown). Other elements of the electronic circuit include a resistive heater, which dissipates about 0.25 W, provided to heat the FET by about 40K, several diodes, a light emitting diode to blank the FET, and other elements. If other electrically dissipative elements are provided, they may advantageously be mounted near the FET to help provide the necessary heat.

Other types of detectors are known, and may be employed, including germanium crystals, used as X-ray or gamma ray detectors, and which generally require lower temperatures for high performance than silicon (lithium drifted) crystal detectors.

EXAMPLE 2

The apparatus generally according to Example 1 is provided with a large amount molecular sorption getter 5, 16, provided as portions of activated carbon material, as shown in FIGS. 5 and 6. According to this embodiment, the void volume 22 in the evacuated chamber is minimized. This is in contrast to the design according to Example 1, wherein the void volume 22 is not particularly minimized, except to reduce the internal surface area. In fact, under normal circumstances, the void volume in the apparatus of Example 1 is not minimized, so that the adverse effects of outgassing are reduced or diluted in a larger volume.

The molecular sorption getter 5, 16 therefore may occupy a significant portion of the void volume 22 in the evacuated space. For example, the molecular sorption getter 5, 16 may be placed around the expansion chamber 4 and adjacent to the counter flow heat exchanger 3. The molecular sorption getter 5 preferably does not link the internal mass damper 8 and the cryocooler 3, as these should be free for effective damping of vibration.

An additional molecular sorption getter 16 may also be provided on the internal mass damper 3, e.g., adjacent to the flexible copper thermally conductive strap 10.

The molecular sorption getter 5 is provided in firm thermal contact with cooled components of the device, by, e.g., a thermally conductive epoxy. Such a thermally conductive epoxy may be a silver powder filled two-part epoxy material. Additional molecular sorption getter 16 material is provided in a thermally conductive pouch mounted with epoxy to the internal inertial mass damper 8, e.g., thin wall aluminum foil having gas permeable apertures.

Alternatively, the molecular sorption getter may be provided as an organic polymer shaped in the desired configuration which is pyrolyzed to produce a shaped getter. The molecular sorption getter may also be a zeolite or synthetic zeolite material, as known in the art.

Molecular sorption getter materials have the characteristic that their affinity for molecular species increases as the temperature decreases. Thus, as the cryogenic detector device is initially cooled, the pressure in the void volume 22 decreases, as the number of free gas molecules in the evacuated space is reduced. This reduces the heat conduction, thus reducing the parasitic heat load on the cryogenic refrigerator system.

EXAMPLE 3

Figure 7:
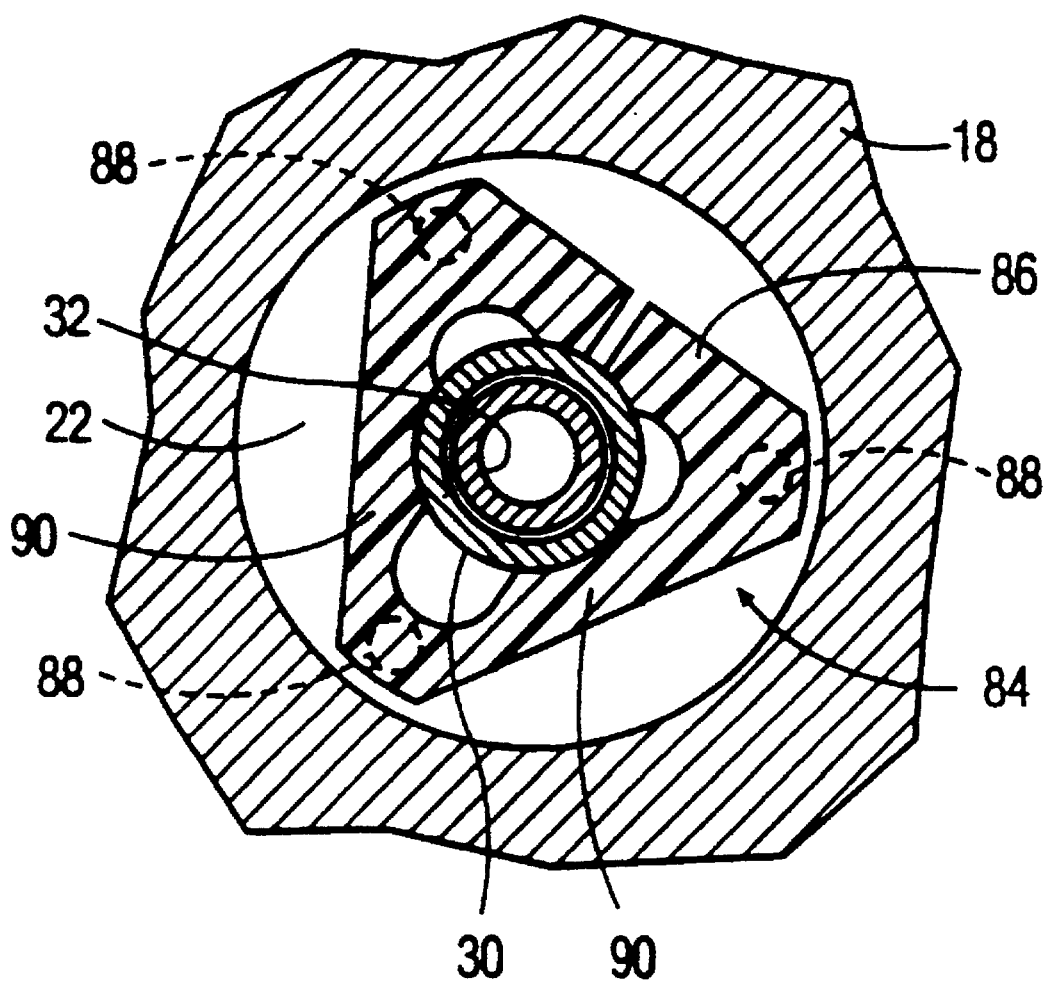
FIG. 7 is a cutaway view of the X-ray radiation detector of FIG. 6 along line A—A, showing a mechanical support for the cold tube.

As shown in FIGS. 6 and 7, a cold sleeve system similar to that employed in U.S. Pat. No. 5,235,817, incorporated herein by reference, may be used to allow the present cryocooler to achieve the temperatures necessary for high performance X-ray detectors, e.g., less than about 95K. As shown in FIGS. 6 and 7, a cold sleeve 26 is provided concentrically around the cold finger 32, with the cold sleeve 26 thermally connected to the cryocooler 3 through a separate strap 13. Since the cold sleeve 26 is isolated from the cold finger 32 and the detector 34, the cold sleeve need not be fully vibration isolated. This cooled sleeve 26, a tube circumjacent to the cold finger 32, shunts parasitic radiated heat input away from the cold finger 32 structure in a separate heat path to the cryocooler. Further, the thermal radiation between surfaces is minimized by providing specular surfaces and by minimizing the surface areas of the facing surfaces. The closeness of spacing of the cold finger 32 and cold sleeve 26 is inconsequential with respect to the radiation coupling because of the low attenuation through the vacuum of the void volume 22. In this case, the cold sleeve 26 may be a copper tube 7/16" in inner diameter. At a given temperature, the amount of radiation from or to a member will be proportional to its surface area, and thus the thermal coupling between two concentric tubes will be minimized by reducing their surface areas.

The cold sleeve is supported and centered within the extension of the housing 35 by a support disk 90.

Advantageously, the cold sleeve is provided with an aperture 37 exposing the FET 28 to the radiant heat from the warm extension of the housing 35. This aperture 37 reduces the need for heating of the FET 28 to provide optimum temperature for operation. Further, the aperture 37 also allows the cold finger 32 to be centered and supported by a support member 29, which passes through the aperture. The support member 29 provides a further heat flow path to warm the FET 28. Thus, the cold sleeve 26 allows reduced parasitic heat input to the cold finger 32, thus allowing a smaller temperature gradient along its length.

EXAMPLE 4

As shown in FIG. 9, the apparatus generally according to Examples 1, 2 or 3, may be provided with a vibration sensor 100, in order to electrically compensate for vibration-induced output variations. In order to allow accurate compensation, it is preferred that hysteresis be eliminated as much as possible and that the device output be repeatable. Thus, for example, adhesives, such as might be used to attach Velcro, have creep, and contribute the hysteresis. Loosely packed getter granules may shift due to vibration, and are avoided. Mylar sheet must be wrapped firmly and affixed securely. Other components should also be designed and mounted to eliminate hysteresis.

It should be noted that, with output compensation, mechanical damping may not be necessary.

A three axis vibration sensor 100 having a 25–100 mg full scale range, is mounted on the outer casing 15 of the cryocooler. The vibration sensor 100 output is digitized with a 16 bit resolution analog to digital converter at between about 10–50 kHz sample rate. The data acquisition system is an ISA card in an Intel Pentium 90 MHz processor-based desktop computer 101. The processor first processes the vibration sensor data alone in order to determine calculate a vibration force at the detector crystal. The processor then calculates a compensation of the detector crystal output based on the measured vibration.

A model of the vibration is generated by instrumenting the sensor system to actually measure vibration at the detector crystal position, while running the cryocooler, and measuring vibration with the external vibration sensor 100. This instrumented setup correlates measured vibration by the external vibration sensor with vibration at the detector crystal. The effect of vibration on the detector crystal is then determined by operating the detector system using standardized radiation sources, thereby allowing determination of the effect of vibration on the sensor output.

Acceptable types of vibration sensors include piezoelectric sensors, strain gages, moving mass accelerometers, optical, fiber optic, and other known types.

The sensor system may also be compensated for other factors, such as slight variations in electron beam voltage or current, temperature variations, vacuum pressure, time since crystal detector blanking, time since FET blanking, and other factors.

EXAMPLE 5

Figure 10:
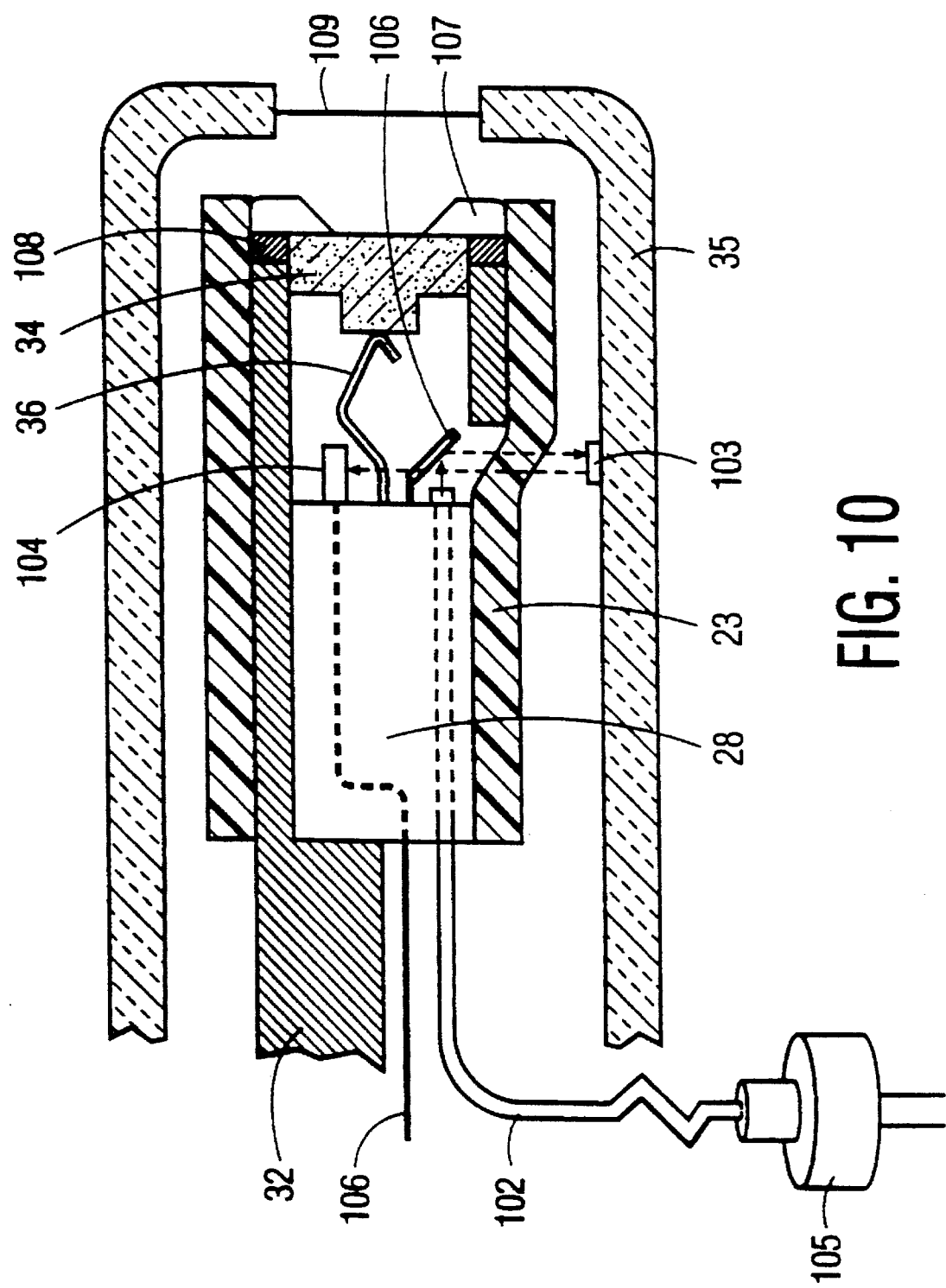
FIG. 10 is a side view of an optical interferometer for measuring vibrational-induced displacements of the detector crystal.

As shown in FIG. 10, the system generally according to Example 4 is provided, with the exception that a fiber optic interferometer is provided to determine a relative motion between the detector holder 23 and the housing 35. A reflective portion 103 is provided on an inner surface of the housing 35. A laser diode 105, producing a coherent infrared polarized monochromatic light, e.g., at about 940 μm, is coupled to an optical fiber 102, which terminates near the FET 28 and transmits the light. Light exits the optical fiber 102 and is directed through a semireflective mirror 106 to the reflective portion 103. The detector crystal 34 may be shielded from the illumination to prevent detector artifacts. A portion of the light exiting the fiber is also directed by the semireflective mirror 106 directly to a photodetector 104. Light reflecting off the reflective portion 103 is also reflected to the photodetector 104 by the semireflective mirror 106 to produce an interference pattern relating to a difference in path length of the two light paths, modulating the amplitude of the photodetector 104 output. The output is transmitted through a wire 106. Therefore, by detecting the intensity of light by the photodetector 104, the slight change in distance between the tip of the optical fiber 102 detector and the housing 35 due to vibration may be determined. The photodetector 104 output is lead from the evacuated chamber and fed to the compensation processor.

X-ray radiation passes through the window 109 and is incident on the detector crystal 34. Photonic-induced charge is swept from the detector crystal 34 to the gate of the FET 28 through a beryllium copper spring contact 36. Relative movement between the FET 28 and the housing 35 also induces charge due to electrostatic effects. The interferometer system allows submicron relative motions to be detected and quantified. Thus, the influence of vibration may be compensated by determining the vibration displacement waveform and compensating the output of the FET 28 amplifier circuit based on a determined relationship between vibration and output of the amplifier circuit.

One or more additional interferometers may also be provided for vibration compensation.

In an alternative embodiment, the optical interferometer is used in a closed circuit vibration suppression system, wherein an actuator is provided along the axis of measurement of the interferometer. An actuator, such as a piezoelectric actuator, is driven to null the measured displacement. Therefore, relative displacement induced output variations will be suppressed.

EXAMPLE 6

In order to provide improved electrical performance, it is desired to electrically isolate the compressor system from the detector. The compressor 45 is electrically operated, and thus has a magnetic fields which may induce small currents. Further, the compressor 45 may be distant from the detector, and therefore the possibility of significant ground loops is present. Finally, by electrically isolating the detector 34 from the compressor 45, the electronic outputs of the detector may be more easily integrated with the electronics of the X-ray device without interference.

Normal supply 1 and return 2 tubing for compressed refrigerant gas is formed of malleable copper tubing. This tubing 1, 2 is conductive. Generally available flexible nonconductive tubing may be unsuitable for this purpose, as it may leak, introduce contaminants or kink.

Figure 8:
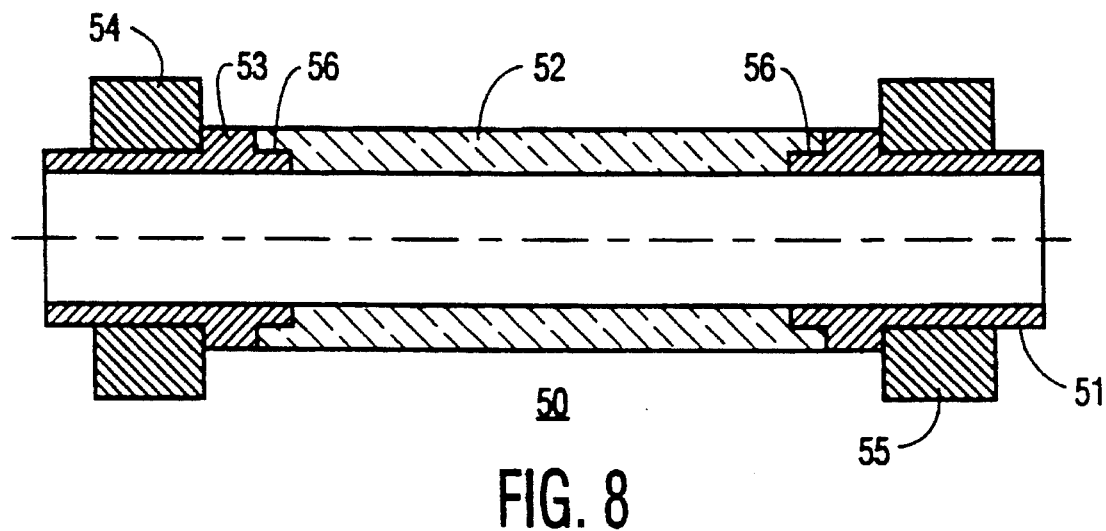
FIG. 8 is a cross section of an insulating tube insert according to the present invention.

The present invention employs standard conductive malleable metal tubing with an electrical isolation device 50, as shown in FIG. 8, in line with the tubing. The isolation device 50 must contain the high pressure of the supply line, without introducing contaminants.

The electrical isolation device includes a glass or ceramic length of tubing 52, preferably Macor®, which is about preferably about 5–10 cm in length, although any length sufficient to provide electrical insulation may be used. Each end of the tube 52 is counterbored with a recessed groove 56. The tubing 52 is brazed to stainless steel fittings 51, 53 which conform to the counterbored recessed grooves 56 to form a gas-tight and mechanically strong seal. The brazed fittings 51, 53 are further coupled to stainless steel mechanical fittings 54, 55, for connection to the supply 1 and return 2 line tubing.

In a preferred embodiment, on at least one side of the isolation device 50, the stainless steel fitting is a standard-type self sealing, quick release fitting, available from Aeroquip, allowing the detector to be easily separated from the compressor.

It should be understood that the preferred embodiments and examples described herein are for illustrative purposes only and are not to be construed as limiting the scope of the present invention, which is properly delineated only in the appended claims.

What is claimed is:

1. A cryogenic cooling apparatus for a radiation detector, comprising:

a Joule-Thomson closed cycle cryogenic cooler having a high pressure compressed refrigerant supply conduit, a flow limiting orifice and a refrigerant return conduit, said Joule-Thomson closed cycle cryogenic cooler producing a vibration during operation;

a thermally conductive member having a first portion and a second portion, being in thermal and mechanical communication with said Joule-Thomson closed cycle cryogenic cooler at said first portion, and having a nonunity vibration transmission function from said first portion to said second portion of said thermally conductive member; and a cryogenic radiation detector, having a sensitivity to radiation and to vibration and having an output, mounted in thermal communication with said second portion of said thermally conductive member, said nonunity vibration transmission function modifying vibrations to which said detector is sensitive, to reduce an effect of said vibration on said output.

2. The cryogenic cooling apparatus according to claim 1, further comprising a counter flow heat exchanger between said high pressure refrigerant supply conduit and said refrigerant return conduit, allowing heat exchange between cooled returning refrigerant and said high pressure compressed refrigerant supply.

3. The cryogenic cooling apparatus according to claim 1, wherein said Joule-Thomson closed cycle cryogenic cooler reaches a minimum temperature of below about 77K.

4. The cryogenic cooling apparatus according to claim 1, wherein said Joule-Thomson closed cycle cryogenic cooler produces an undamped vibration of at least about 5 mg RMS which is attenuated to less than about 4.5 mg RMS.

5. The cryogenic cooling apparatus according to claim 1, wherein said Joule-Thomson closed cycle cryogenic cooler has a maximum thermal capacity of about 2 Watts when a temperature of said thermally conductive member is about 82K.

6. The cryogenic cooling apparatus according to claim 1, further comprising a throttle valve at said flow limiting orifice, controlling a flow of refrigerant from said high pressure supply conduit.

7. The cryogenic cooling apparatus according to claim 6, wherein said throttle valve is responsive to a temperature of said refrigerant downstream of said flow limiting orifice.

8. The cryogenic cooling apparatus according to claim 1, wherein said detector is an X-ray detector.

9. The cryogenic cooling apparatus according to claim 1, wherein said detector is a lithium drifted silicon crystal X-ray detector.

10. The cryogenic cooling apparatus according to claim 1, wherein said detector is a germanium crystal radiation detector.

11. The cryogenic cooling apparatus according to claim 1, wherein said detector is an X-ray detector of an electron microscope, achieving an energy resolution FWHM of less than or equal to about 137 eV at 5.9 keV, from an $^{55}$Fe source, at 1000 cps with a 40 µS time constant.

12. The cryogenic cooling apparatus according to claim 1, wherein said detector is an X-ray detector of an electron microscope having a spatial resolution, said vibration being attenuated to a level which causes an insignificant error in said spatial resolution.

13. The cryogenic cooling apparatus according to claim 1, wherein said detector is provided in an evacuated space.

14. The cryogenic cooling apparatus according to claim 13, wherein said cryogenic cooler, thermally conductive member and detector are housed in said evacuated space, said evacuated space being sealed with a single vacuum seal.

15. The cryogenic cooling apparatus according to claim 1, further comprising a vibration damper linked to said high pressure compressed refrigerant supply conduit.

16. The cryogenic cooling apparatus according to claim 15, further comprising a mass linked to said high pressure refrigerant supply conduit for reducing transmitted vibration from said high pressure compressed refrigerant supply to said closed cycle cryogenic cooler.

17. The cryogenic cooling apparatus according to claim 15, wherein said vibration damper comprises a relief valve at said high pressure refrigerant supply conduit.

18. The cryogenic cooling apparatus according to claim 1, wherein said thermally conductive member comprises a mechanical filter to attenuate transmitted vibrations.

19. The cryogenic cooling apparatus according to claim 1, further comprising a mechanically compliant thermal coupling between said thermally conductive member and said detector.

20. The cryogenic cooling apparatus according to claim 1, wherein said detector is provided in an evacuated space, further comprising a molecular sorption getter composition mounted in said evacuated space of sufficient quantity to achieve a molecular gas flow at cryogenic temperatures.

21. The cryogenic cooling apparatus according to claim 20, wherein said a molecular sorption getter composition is mounted in thermal communication with one or both of said cryogenic cooler and said thermally conductive member.

22. The cryogenic cooling apparatus according to claim 20, wherein said molecular sorption getter is activated carbon.

23. The cryogenic cooling apparatus according to claim 20, wherein said molecular sorption getter is preformed as an organic polymer material or a mass of biological material and subsequently converted to activated carbon.

24. The cryogenic cooling apparatus according to claim 1, further comprising an insulating conduit portion in sequence with said high pressure compressed refrigerant supply conduit, electrically isolating said cryogenic cooling apparatus.

25. The cryogenic cooling apparatus according to claim 24, wherein said insulating conduit is a tube formed of a material selected from the group consisting of glass, ceramic and Macor.

26. The cryogenic cooling apparatus according to claim 24, wherein said insulating conduit is brazed in sealed manner to a connection fitting.

27. A method of cryogenically cooling a radiation detector, comprising the steps of:

(a) providing:
   a closed cycle cryogenic cooler having a high pressure compressed refrigerant supply conduit, an expansion chamber, an flow limiting orifice from said compressed refrigerant supply conduit to said expansion chamber, and a refrigerant return conduit, said closed cycle cryogenic cooler being subject to the generation of vibration during operation;
   a thermally conductive member having a first portion and a second portion, being in thermal and mechanical communication with said closed cycle cryogenic cooler at said first portion, and having a nonunity vibration transmission function from said first portion to said second portion of said thermally conductive member; and
   a cryogenic radiation detector, having a sensitivity to radiation and to vibration and an output, mounted in thermal communication with said second portion of said thermally conductive member, said nonunity vibration transmission function modifying vibrations to which said detector is sensitive, to reduce an effect of said vibration on said output;

(b) providing a compressed refrigerant supply to said supply conduit; and (c) venting expanded refrigerant from said return refrigerant conduit.

28. The method according to claim 27, further comprising the step of recycling said vented expanded refrigerant.

29. The method according to claim 28, further comprising the step of compressing said vented expanded refrigerant in a compressor.

30. The method according to claims 27, further comprising the step of precooling said compressed supply refrigerant in a counterflow heat exchanger provided between said high pressure refrigerant supply conduit and said refrigerant return conduit, cooled refrigerant from said expansion chamber flowing in said refrigerant return conduit cooling said compressed supply refrigerant.

31. The method according to claim 27, further comprising the step of attenuating vibration in said high pressure compressed refrigerant supply conduit.

32. The method according to claim 27, wherein said detector is a lithium drifted silicon X-ray detector.

33. The method according to claim 27, wherein said detector is a germanium radiation detector.

34. The method according to claim 27, further comprising the step of controlling a flow of compressed refrigerant through said orifice into said expansion chamber with a throttle valve provided at said orifice.

35. The method according to claim 34, wherein said flow of compressed refrigerant is controlled based on a temperature in said expansion chamber.

36. The method according to claim 27, further comprising the step of maintaining an evacuated inner portion of a housing.

37. The method according to claim 27, further comprising the step of damping vibration from said cryogenic cooler transmitted to said detector.

38. The method according to claim 27, further comprising the step of attenuating transmitted vibration with a mechanically compliant thermal coupling between said thermally conductive member and said detector.

39. The method according to claim 27, further comprising the steps of detecting an X-ray in an electron microscope, and attenuating vibration received by said detector so that an energy resolution is achieved having an FWHM of less than or equal to about 137 eV at 5.9 keV from $^{55}$Fe at 1000 cps with a 40 μS time constant.

40. The method according to claim 27, wherein said cryogenic cooler, thermally conductive member and detector are housed in an evacuated chamber, said chamber being sealed with a single vacuum seal.

41. The method according to claim 27, further comprising the step of reducing transmitted vibration from said high pressure compressed refrigerant supply to said closed circuit cryogenic cooler by affixing a mass to said refrigerant supply conduit.

42. The method according to claim 27, wherein said cryogenic cooler, thermally conductive member and detector arc housed in an evacuated chamber, further comprising the step of gettering contaminants in said chamber with a getter material provided in sufficient quantities to achieve a molecular gas flow at cryogenic temperatures.

43. The method according to claim 42, further comprising the step of cooling a molecular sorption getter.

44. The method according to claim 43, wherein said molecular sorption getter is activated carbon.

45. The method according to claim 43, wherein said molecular sorption getter is preformed as an organic polymer or a biological material and converted to activated carbon.

46. The method according to claim 27, further comprising the step of electrically isolating said compressed refrigerant supply from said detector by passing the compressed refrigerant through an insulating conduit.

47. A cryogenic cooling apparatus for a radiation detector, comprising:

a cryogenic cooler having a vibration of operation, said vibration of operation being of at least a first level;

an uncompensated detector, having a sensitivity to radiation and to vibration, and an output, which the detector is mounted in thermal communication with said cryogenic cooler, said uncompensated detector producing an unacceptable output resolution when subject to vibration of at least said first level and producing an acceptable output resolution of at worst about 140 eV at 5.9 keV from $^{55}$Fe at 1000 cps with a 40 μS time constant when subject to vibration of at most a second level; and a vibration compensation system reducing an effect of the vibration on said detector output so that, when said cryogenic cooler produces at least said first level of the vibration, said compensation system produces said acceptable output resolution.

48. The cryogenic cooling apparatus according to claim 47, wherein said vibration compensation system comprises a passive mechanical vibration attenuation structure.

49. The cryogenic cooling apparatus according to claim 47, wherein said vibration compensation system comprises an active electro-mechanical vibration attenuation system.

50. The cryogenic cooling apparatus according to claim 47, wherein said vibration compensation system comprises an active electronic compensation circuit at said output of said detector.

51. The cryogenic cooling apparatus according to claim 47, wherein said vibration compensation system comprises a viscous fluid link having a fluid which does not substantially support shear wave propagation in a mechanically compliant conduit.

52. The cryogenic cooling apparatus according to claim 47, wherein said vibration compensation system comprises a flexible thermally conductive link which damps transmitted vibration between said closed cycle cryogenic cooler and said detector.

53. The cryogenic cooling apparatus according to claim 47, wherein said vibration compensation system comprises one or more piezoelectric actuators.

54. The cryogenic cooling apparatus according to claim 47, wherein said vibration compensation system comprises an electronic circuit having a vibration transducer mounted to determine a vibration of said cryogenic cooling apparatus.

55. The cryogenic cooling apparatus according to claim 47, wherein said vibration compensation system comprises a transducer, an actuator and a control for driving said actuator to null an output of said transducer.

56. The cryogenic cooling apparatus according to claim 47, wherein said vibration compensation system comprises a compensation detector, having a response to said vibration having a predetermined relation to a response of said detector to said vibration.

57. The cryogenic cooling apparatus according to claim 47, wherein said vibration compensation system comprises a high temperature superconductor.

58. A detector system for measuring an energy of an X-ray, comprising:

(a) a lithium drifted silicon crystal X-ray detector system having an X-ray sensitivity and a vibration sensitivity, X-rays and vibration each causing a variation in an output current of said x-ray detector system, said x-ray detector system including an electrical amplifier circuit receiving said output current and producing an amplified signal;

(b) a support for said detector system, said support being coupled to a device subject to a mechanical vibration, said amplified signal of said x-ray detector system amplifier having a vibration-related signal component which, in the absence of compensation, increases a FWHM of said output to an amount greater than about 140 eV at 5.9 kev from $^{55}$Fe at 1000 cps with a 40 μS time constant; and (c) means for compensating said vibration-related increase in FWHM of said x-ray detector system amplifier to an amount less than or equal to about 137 eV at 5.9 kev from $^{55}$Fe at 1000 cps with a 40 μS time constant.

59. The detector system according to claim 58, wherein said compensating means comprises a mechanical vibration attenuation device coupled with said support.

60. The detector system according to claim 58, wherein said compensating means comprises an electrical signal processing system for processing said output.

61. The detector system according to claim 60, wherein said electrical signal processing system comprises a vibration sensor and a deconvolution processor.

\* \* \* \* \*